(12) United States Patent
Kim et al.

(10) Patent No.: US 11,258,042 B2
(45) Date of Patent: Feb. 22, 2022

(54) DISPLAY APPARATUS HAVING A BARRIER WALL

(71) Applicant: Samsung Display Co., Ltd., Yongin-si (KR)

(72) Inventors: Jaehyun Kim, Yongin-si (KR); Daesang Yun, Yongin-si (KR); Cheho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 19 days.

(21) Appl. No.: 16/787,715

(22) Filed: Feb. 11, 2020

(65) Prior Publication Data

US 2020/0335722 A1    Oct. 22, 2020

(30) Foreign Application Priority Data

Apr. 22, 2019    (KR) .................. 10-2019-0046936

(51) Int. Cl.
*H01L 51/52*    (2006.01)
*H01L 27/32*    (2006.01)
*H01L 33/44*    (2010.01)

(52) U.S. Cl.
CPC ...... *H01L 51/5253* (2013.01); *H01L 27/3244* (2013.01); *H01L 27/3246* (2013.01); *H01L 33/44* (2013.01); *H01L 2251/301* (2013.01)

(58) Field of Classification Search
CPC .......... H01L 51/5253; H01L 2251/301; H01L 27/3246; H01L 27/3295; H01L 33/44; G02F 2001/133357
See application file for complete search history.

(56) References Cited

U.S. PATENT DOCUMENTS

| | | | |
|---|---|---|---|
| 9,412,972 B2 | 8/2016 | Shim et al. | |
| 9,893,312 B2 | 2/2018 | Park | |
| 10,181,584 B2 | 1/2019 | Lee et al. | |
| 10,347,853 B2* | 7/2019 | Park | H01L 51/0023 |
| 10,396,310 B2* | 8/2019 | Choi | H01L 27/3246 |
| 10,608,199 B2* | 3/2020 | Kim | G09G 3/3291 |
| 10,644,084 B2* | 5/2020 | Lhee | H01L 27/3258 |
| 10,770,681 B2* | 9/2020 | Lee | H01L 27/3246 |
| 10,840,478 B2* | 11/2020 | Han | H01L 27/3262 |
| 2013/0059155 A1 | 3/2013 | Choi et al. | |
| 2016/0079564 A1 | 3/2016 | Shim et al. | |
| 2016/0197308 A1 | 7/2016 | Jeong | |
| 2016/0233248 A1 | 8/2016 | Kwak et al. | |
| 2018/0083227 A1 | 3/2018 | Ju et al. | |
| 2018/0090718 A1 | 3/2018 | Lee et al. | |
| 2018/0097034 A1* | 4/2018 | Lee | H01L 27/3276 |
| 2018/0102502 A1* | 4/2018 | Kim | H01L 27/3276 |
| 2018/0151642 A1 | 5/2018 | Oh | |

(Continued)

FOREIGN PATENT DOCUMENTS

CN    109065760 A    12/2018
JP    2012-4063 A    1/2012

(Continued)

*Primary Examiner* — Ida M Soward
(74) *Attorney, Agent, or Firm* — Lewis Roca Rothgerber Christie LLP

(57) ABSTRACT

A display apparatus is provided. In the display apparatus, because an inorganic encapsulation layer of a thin film encapsulation layer is not separated from another layer, a lifespan of the display apparatus may be increased.

20 Claims, 12 Drawing Sheets

(56) References Cited

U.S. PATENT DOCUMENTS

| | | | |
|---|---|---|---|
| 2018/0159077 A1* | 6/2018 | Lee | H01L 27/3244 |
| 2018/0226612 A1 | 8/2018 | Choi et al. | |
| 2019/0131379 A1* | 5/2019 | Won | H01L 27/323 |
| 2019/0214446 A1* | 7/2019 | Kim | H01L 27/3258 |
| 2019/0296099 A1* | 9/2019 | Lee | H01L 27/3246 |
| 2019/0355930 A1* | 11/2019 | Lee | H01L 51/5253 |
| 2020/0174305 A1* | 6/2020 | Tokuda | G02F 1/133305 |
| 2020/0194725 A1 | 6/2020 | Qin et al. | |
| 2020/0235338 A1* | 7/2020 | Kim | H01L 27/3246 |
| 2020/0286961 A1* | 9/2020 | Jeong | H01L 27/3223 |

FOREIGN PATENT DOCUMENTS

| | | |
|---|---|---|
| JP | 2012-151060 A | 8/2012 |
| KR | 10-1473309 B1 | 12/2014 |
| KR | 10-2016-0032800 A | 3/2016 |
| KR | 10-2016-0083986 A | 7/2016 |
| KR | 10-2017-0092737 A | 8/2017 |
| KR | 10-2018-0031884 A | 3/2018 |
| KR | 10-2018-0033352 A | 4/2018 |
| KR | 10-2018-0091987 A | 8/2018 |

* cited by examiner

DISPLAY APPARATUS HAVING A BARRIER WALL

CROSS-REFERENCE TO RELATED APPLICATION

This application claims priority to and the benefit of Korean Patent Application No. 10-2019-0046936, filed on Apr. 22, 2019 in the Korean Intellectual Property Office, the disclosure of which is incorporated herein in its entirety by reference.

BACKGROUND

1. Field

One or more embodiments relate to an apparatus, and more particularly, to a display apparatus.

2. Description of the Related Art

A display apparatus is an apparatus for displaying images and may include a liquid crystal display, an electrophoretic display, an organic light-emitting display, an inorganic light-emitting display, a field emission display, a surface-conduction electron-emitter display, a plasma display, a cathode ray display, etc.

A display apparatus includes a display area and a non-display area, wherein the display area displays images and the non-display area has wires arranged therein for transferring signals to the display area. Recently, in order to realize a thin and lightweight display apparatus while maintaining high quality, research into techniques of encapsulating the display area and the non-display area by using an organic layer has been actively conducted.

SUMMARY

An aspect of one or more embodiments is directed toward a display apparatus having a thin film encapsulation layer that has increased adherence (e.g., may not be separated) while preventing or protecting from infiltration of external moisture and/or oxygen.

It will be appreciated by one of ordinary skill in the art that that the objectives and effects that could be achieved with the disclosure are not limited to what has been particularly described above, and other objectives of the disclosure will be more clearly understood from the following detailed description.

Additional aspects will be set forth in part in the description which follows and, in part, will be apparent from the description, or may be learned by practice of the presented embodiments.

According to one or more embodiments, a display apparatus includes: a substrate including a display area for displaying images and a non-display area adjacent to (e.g., on an outer portion of) the display area; a thin film encapsulation layer including a first inorganic encapsulation layer, an organic encapsulation layer, and a second inorganic encapsulation layer stacked on the substrate; a barrier wall on the non-display area; and a capping layer between the substrate and the thin film encapsulation layer in a first direction, an end of the capping layer being located on an outer portion of the barrier wall.

The capping layer may include an inorganic material.

The inorganic material may include at least one selected from $SiN_x$, $TiO_x$, $ZrO_x$ and $HfO_x$.

The end of the capping layer may be closer to the barrier wall than an end of at least one of the first inorganic encapsulation layer and the second inorganic encapsulation layer is to the barrier wall in a second direction perpendicular to the first direction.

The end of the capping layer may be farther from the barrier wall than an end of at least one of the first inorganic encapsulation layer and the second inorganic encapsulation layer is to the barrier wall in a second direction perpendicular to the first direction.

The end of the capping layer and an end of at least one of the first inorganic encapsulation layer and the second inorganic encapsulation layer may be identical in location to each other in a second direction perpendicular to the first direction.

At least one of the end of the capping layer, an end of the first inorganic encapsulation layer and an end of the second inorganic encapsulation layer and an end of the substrate are identical in location to each other in a second direction perpendicular to the first direction.

The barrier wall may include: a first barrier wall on the non-display area; and a second barrier wall on the non-display area, the second barrier wall being spaced from the first barrier wall.

The capping layer, the first inorganic encapsulation layer, and the second inorganic encapsulation layer may be sequentially stacked in the first direction on an area between the barrier wall and an end of the substrate in a second direction perpendicular to the first direction.

The capping layer may have a refractive index of 1.8 or greater.

According to one or more embodiments, a display apparatus includes: a substrate including a display area for displaying images and a non-display area adjacent to (e.g., on an outer portion of) the display area; a thin film encapsulation layer including a first inorganic encapsulation layer, an organic encapsulation layer, and a second inorganic encapsulation layer stacked in a first direction on the substrate; a barrier wall on the non-display area; a cladding layer on the substrate, the cladding layer being spaced from the barrier wall towards an end of the substrate in a second direction perpendicular to the first direction; and a capping layer between the substrate and the thin film encapsulation layer in the first direction, the capping layer being at least partially located between the barrier wall and the cladding layer in the second direction.

The capping layer may include an inorganic material.

The inorganic material may include at least one selected from $SiN_x$, $TiO_x$, $ZrO_x$, and $HfO_x$.

An end of the capping layer may be between the barrier wall and the cladding layer in the second direction.

An end of the capping layer and an end of the substrate are identical in location to each other other in the second direction.

An end of the capping layer may be at a location different from an end of at least one of the first inorganic encapsulation layer and the second inorganic encapsulation layer in the second direction, or the end of the capping layer may be at a same location as the end of at least one of the first inorganic encapsulation layer and the second inorganic encapsulation layer in the second direction.

The capping layer, the first inorganic encapsulation layer, and the second inorganic encapsulation layer may be sequentially stacked in the first direction on an area between the barrier wall and an end of the substrate in the second direction.

According to one or more embodiments, a display apparatus includes: a substrate including a display area for displaying images and a non-display area adjacent to (e.g., on an outer portion of) the display area; a thin film encapsulation layer including a first inorganic encapsulation layer, an organic encapsulation layer, and a second inorganic encapsulation layer stacked on the substrate; a barrier wall on the non-display area; and a capping layer between the substrate and the thin film encapsulation layer, the capping layer covering a front surface of the barrier wall, and the capping layer including an inorganic material.

A density of the capping layer may be greater than a density of at least one of the first inorganic encapsulation layer and the second inorganic encapsulation layer.

The capping layer may have a thickness of 1000 Å or less.

Other aspects, features, and advantages of the disclosure will become better understood through the accompanying drawings, the claims, and the detailed description.

Such general and specific aspects of the disclosure may be performed using systems, methods, computer-readable storage mediums, and/or combinations thereof.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
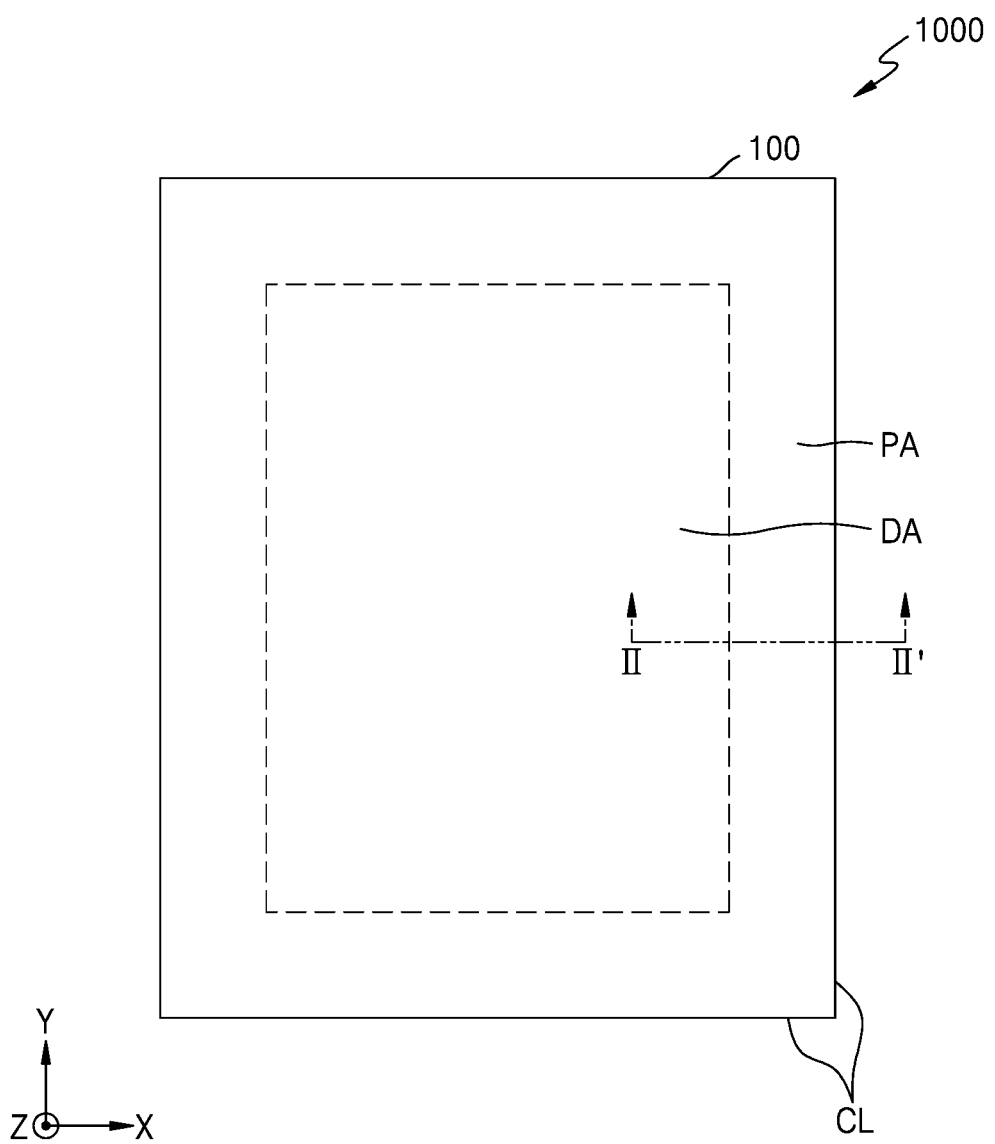
FIG. 1 is a plan view of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," "one of," "selected from," "at least one selected from," and "one selected from," when preceding a list of elements, modify the entire list of elements and do not modify the individual elements of the list. Further, the use of "may" when describing embodiments of the present disclosure refers to "one or more embodiments of the present disclosure."

The example embodiments will be described below in more detail with reference to the accompanying drawings. Those components that are the same or are in correspondence are rendered with like reference numerals regardless of the figure number, and redundant explanations are not provided again.

While such terms as "first," "second," etc., may be used to describe various components, such components are not to be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It should be understood that when an element such as a layer, film, region, or substrate is referred to as being "on" another element, it can be directly on the other element or intervening element(s) may also be present. In contrast, when an element is referred to as being "directly on" another element, no intervening elements are present.

Sizes of components in the drawings may be exaggerated for convenience of explanation. In other words, since sizes and thicknesses of components in the drawings are arbitrarily illustrated for convenience of explanation, the following embodiments are not limited thereto.

The X-axis, the Y-axis, and the Z-axis are not limited to three axes of the rectangular coordinate system, and may be interpreted in a broader sense. For example, the X-axis, the Y-axis, and the Z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
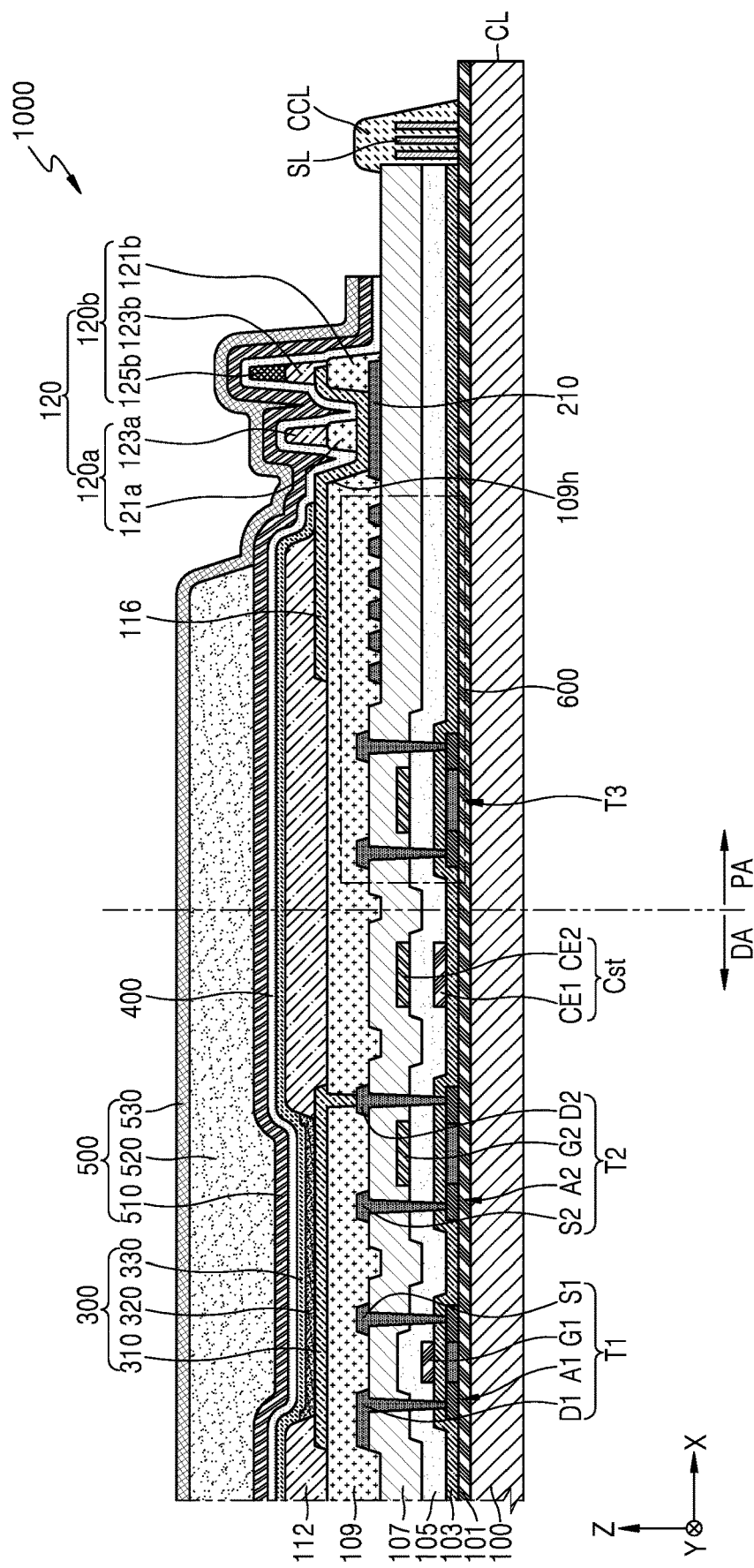
FIG. 2 is a cross-sectional view taken along a line II-II' of FIG. 1.
Figure 3:
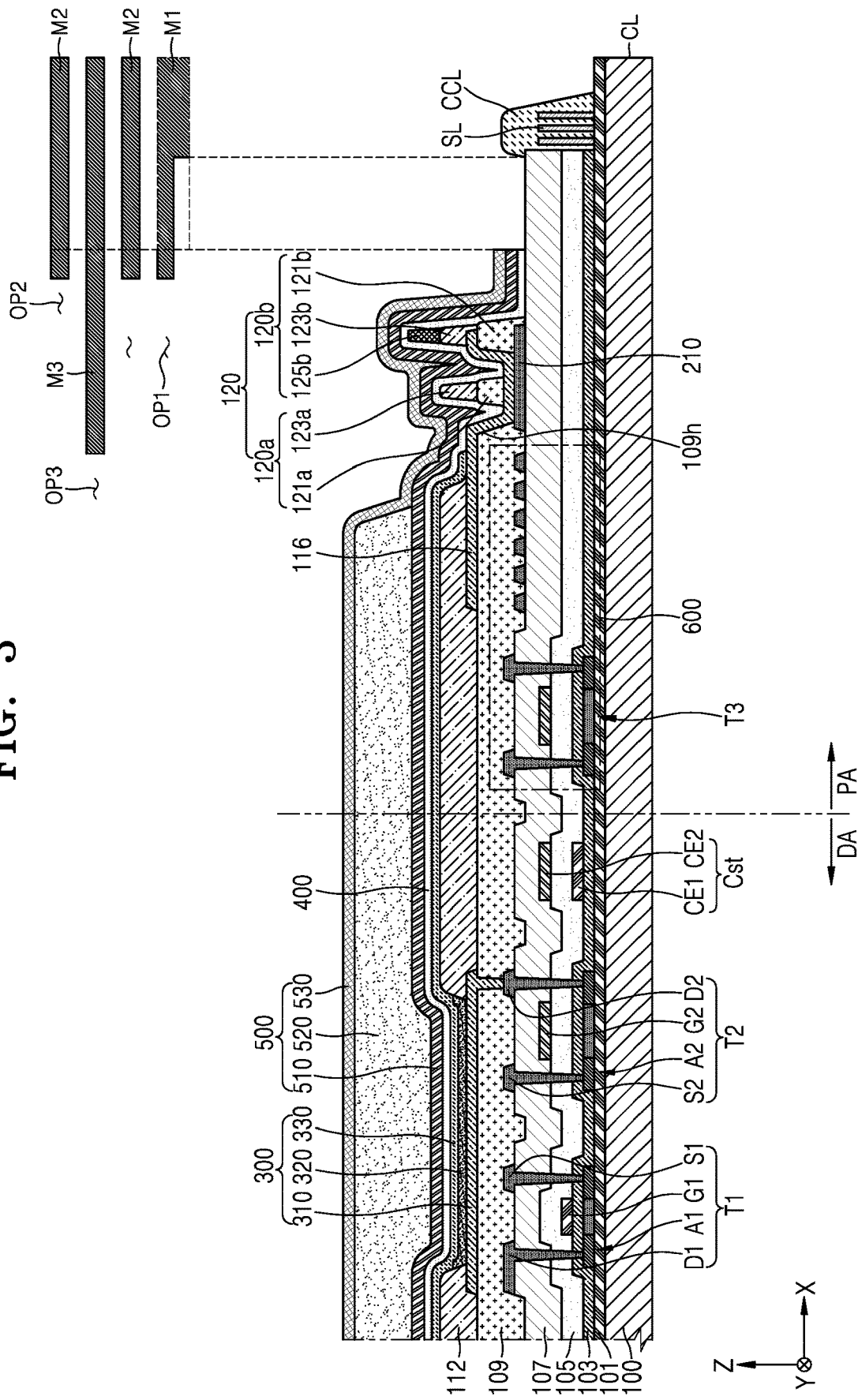
FIG. 3 is a cross-sectional view showing a relationship between the display apparatus of FIG. 2 and a mask used in manufacturing the display apparatus.

FIG. 1 is a plan view of a display apparatus according to an embodiment. FIG. 2 is a cross-sectional view taken along a line II-II' of FIG. 1. FIG. 3 is a cross-sectional view showing a relationship between the display apparatus of FIG. 2 and a mask used in manufacturing the display apparatus.

Referring to FIGS. 1 to 3, the display apparatus 1000 includes a substrate 100. The substrate 100 includes a display area DA and a non-display area PA adjacent to the display area DA.

A plurality of pixels are arranged in the display area DA of the substrate 100 to display images. Various display devices (such as an organic light-emitting device (OLED), a thin film transistor, a capacitor, etc.) may be arranged in the display area DA, and pixels (formed by electrical combination of the display devices, the thin film transistor, the capacitor, etc.) display images. A driving current flowing through the display devices is generated according to a gate signal, a data signal, a driving voltage (ELVDD), a common voltage (ELVSS), etc., supplied to the pixel, and the display device may emit light having a luminance corresponding to the driving current.

The non-display area PA is adjacent to the display area DA. A wiring portion 600 for supplying various signals and/or power source applied to the display area DA may be arranged in the non-display area PA. The wiring portion 600 may include a drive circuit. For example, the drive circuit may include at least one selected from a scan driving circuit, a terminal portion, a driving power supply line, and a second line 210, and may further include a thin film transistor T3 for controlling electrical signals applied to the display area DA. Also, a barrier wall or a trench may be arranged in the non-display area PA, and the barrier wall or the trench may block a flow of an organic layer that is used to manufacture the display apparatus 1000. In this case, at least one selected from the scan driving circuit, the terminal portion, the driving power supply line, the second line 210, and the thin film transistor T3 may be arranged in the non-display area PA at a longer side of the display apparatus 1000 (e.g., the longer side being parallel to the Y-axis) or the non-display area PA at a shorter side of the display apparatus 1000 (e.g., the shorter side being parallel to the X-axis).

The display apparatus 1000 includes the substrate 100 including the display area DA and the non-display area PA, and a thin film encapsulation layer 500 for encapsulating the display area DA and the non-display area PA.

The substrate 100 may include various materials. For example, the substrate 100 may include a transparent glass material containing $SiO_2$ as a main component. However, the substrate 100 is not limited thereto, that is, it may include a transparent plastic material. The plastic material may include an insulating organic material, that is, an organic material selected from the group consisting of a polyether sulfone, polyacrylate, polyetherimide, polyethylene naphthalate, polyethylene terephthalate, polyphenylene sulfide, polyarylate, polyimide, polycarbonate, cellulose triacetate, cellulose acetate propionate, etc. Also, the substrate 100 may have a multi-layered structure including a layer including the plastic material and an inorganic layer.

A buffer layer 101 is located on the substrate 100 to reduce or block infiltration of impurities, moisture, or external air from a lower portion of the substrate 100, and to provide a flat surface on the substrate 100. The buffer layer 101 may include an inorganic material (such as an oxide material and/or a nitride material), an organic material, or an inorganic-organic composite material, and may have a single-layered or multi-layered structure including the inorganic material and/or the organic material.

A first thin film transistor T1 includes a semiconductor layer A1, a first gate electrode G1, a source electrode S1, and a drain electrode D1, and a second thin film transistor T2 includes a semiconductor layer A2, a second gate electrode G2, a source electrode S2, and a drain electrode D2.

Hereinafter, the thin film transistors T1 and T2 are top gate type. However, the embodiment is not limited thereto, and thin film transistors of various types such as a bottom gate type may be adopted.

Also, hereinafter, a case in which two thin film transistors T1 and T2 is described, but one or more embodiments are not limited thereto. In one or more embodiments, the display apparatus 1000 may include two or more thin film transistors T1 and T2 in one pixel. In some embodiments, six or seven thin film transistors may be adopted in one pixel.

The semiconductor layers A1 and A2 may each include amorphous silicon or polycrystalline silicon. In another embodiment, the semiconductor layers A1 and A2 may each include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The semiconductor layers A1 and A2 may include a channel region and a source region and a drain region having higher carrier concentrations than the channel region.

The first gate electrode G1 is arranged on the semiconductor layer A1 with a first gate insulating layer 103 therebetween. The first gate electrode G1 may include molybdenum (Mo), aluminum (Al), copper (Cu), titanium (Ti), etc., and may have a single-layered or multi-layered structure. As an example, the first gate electrode G1 may have a single layer including Mo.

The first gate insulating layer 103 is provided to insulate the semiconductor layer A1 from the first gate electrode G1, and may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc.

The second gate electrode G2 is on the semiconductor layer A2 with the first gate insulating layer 103 and a second gate insulating layer 105 therebetween. The second gate electrode G2 may include a conductive material including molybdenum (Mo), aluminum (Al), copper (Cu), titanium (Ti), etc., and may have a single-layered or multi-layered structure. As an example, the second gate electrode G2 may have a single layer including Mo or a multi-layered structure including Mo/Al/Mo.

The second gate insulating layer 105 may include an inorganic material including an oxide and/or a nitride. For example, the second gate insulating layer 105 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

The source electrodes S1 and S2 and the drain electrodes D1 and D2 are arranged on an interlayer insulating layer 107. The source electrodes S1 and S2 and the drain electrodes D1 and D2 may each include a conductive material including Mo, Al, Cu, Ti, etc., and may have a single-layered or multi-layered structure including the above material(s). For example, the source electrodes S1 and S2 and the drain electrodes D1 and D2 may each have a multi-layered structure including Ti/Al/Ti.

The interlayer insulating layer 107 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc.

As described above, the first gate electrode G1 of the first thin film transistor T1 and the second gate electrode G2 of the second thin film transistor T2 may be at different layers. Accordingly, the first thin film transistor T1 and the second thin film transistor T2 may have different operating ranges.

A first electrode CE1 of a storage capacitor Cst may include the same material at the same layer as the first gate electrode G1. A second electrode CE2 of the storage capacitor Cst overlaps the first electrode CE1 with the second gate insulating layer 105 therebetween. The second electrode CE2 may include the same material at the same layer as the second gate electrode G2.

In FIG. 2, the storage capacitor Cst does not overlap the first thin film transistor T1 and the second thin film transistor T2. However, one or more embodiments are not limited thereto. For example, the storage capacitor Cst may overlap the first thin film transistor T1. In some embodiments, the first electrode CE1 of the storage capacitor Cst may be integrally formed with the first gate electrode G1. That is, the first gate electrode G1 of the first thin film transistor T1 may also function (e.g., be configured) as the first electrode CE1 of the storage capacitor Cst.

A planarization layer 109 is on the source electrodes S1 and S2 and the drain electrodes D1 and D2, and an organic light-emitting diode OLED may be on the planarization layer 109. The planarization layer 109 may include a single-layered or multi-layered structure including an organic material. The organic material may include or be at least one selected from general-purpose polymers (e.g., polymethylmethacrylate (PMMA) and/or polystyrene (PS)), polymer derivatives having phenol groups, acryl-based polymers, imide-based polymers, aryl ether-based polymers, amide-based polymers, fluoride-based polymers, p-xylene-based polymers, vinyl alcohol-based polymers, and blends thereof. Also, the planarization layer 109 may have a composite stack structure including an inorganic insulating layer and an organic insulating layer.

An organic light-emitting diode (OLED) 300 may be on the planarization layer 109 in the display area DA of the substrate 100. The organic light-emitting diode 300 may include a pixel electrode 310, an opposite electrode 330, and an intermediate layer 320 between the pixel electrode 310 and the opposite electrode 330.

The pixel electrode 310 is in contact with one of the source electrode S1 and the drain electrode D1 of the first thin film transistor T1 via an opening formed in the planarization layer 109 to be electrically connected to the first thin film transistor T1. The pixel electrode 310 may be a reflective electrode. For example, the pixel electrode 310 may include a reflective layer including Ag, Mg, Al, Pt, Pd, Au, Ni, Nd, Ir, Cr, and/or a compound thereof, and a transparent or semi-transparent electrode layer on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide, and aluminum zinc oxide (AZO).

A pixel defining layer 112 may be on the planarization layer 109. The pixel defining layer 112 includes an opening corresponding to each sub-pixel, that is, an opening that exposes at least a center of the pixel electrode 310, to define pixels. Also, the pixel defining layer 112 increases a distance between an edge of the pixel electrode 310 and the opposite electrode 330 on the pixel electrode 310 to prevent (or protect from) generation of arc at the edge of the pixel electrode 310. The pixel defining layer 112 may include an organic material, for example, polyimide, hexamethyl disiloxane (HMDSO), etc.

The intermediate layer 320 of the organic light-emitting diode may include a low-molecular weight organic material or a polymer material. When the intermediate layer 320 includes a low-molecular weight material, the intermediate layer 320 may include a hole injection layer (HIL), a hole transport layer (HTL), an emission layer (EML), an electron transport layer (ETL), and/or an electron injection layer (EIL) in a single-layered or multi-layered structure, and examples of the low-molecular weight material may include copper phthalocyanine (CuPc), N,N'-Di(naphthalene-1-yl)-N,N'-diphenyl-benzidine (NPB), and tris-8-hydroxyquinoline aluminum ($Alq_3$). The above layers may be manufactured by a vacuum deposition method.

When the intermediate layer 320 includes a polymer material, the intermediate layer 320 may include an HTL and/or an EML. Here, the HTL may include poly(3,4-ethylenedioxythiophene) PEDOT, and the EML may include a poly-phenylenevinylene (PPV)-based or polyfluorene-based polymer material. The intermediate layer 320 may be obtained by a screen printing method, an inkjet printing method, a laser induced thermal imaging (LITI) method, a vacuum deposition method using a mask, etc.

However, the intermediate layer 320 is not limited thereto, but may have various structures. In addition, the intermediate layer 320 may be formed integrally throughout the plurality of pixel electrodes 310 or may be patterned to correspond to each of the plurality of pixel electrodes 310.

The opposite electrode 330 is arranged above the display area DA and may cover the display area DA as shown in FIG. 2. That is, the opposite electrode 330 may be integrally provided throughout the plurality of organic light-emitting diodes 300 to correspond to a plurality of pixel electrodes 310. In another embodiment, the opposite electrode 330 may cover the display area DA and partially cover the non-display area PA. Hereinafter, for convenience of description, a case in which the opposite electrode 330 covers the display area DA and partially covers the non-display area PA will be described in more detail.

The opposite electrode 330 may be a transmissive electrode. For example, the opposite electrode 330 may be a transparent or a semi-transparent electrode, and may be provided as a metal thin film including Li, Ca, LiF/Ca, LiF/Al, Al, Ag, Mg, and a compound thereof having a small work function. Also, a transparent conductive oxide (TCO) (such as ITO, IZO, ZnO, and/or $In_2O_3$) may be further provided over the metal thin film.

As the pixel electrode 310 is a reflective electrode and the opposite electrode 330 is a transmissive electrode, light emitted from the intermediate layer 320 is emitted towards the opposite electrode 330, that is, a top emission type. However, one or more embodiments are not limited thereto, and the light emitted from the intermediate layer 320 may be emitted towards the substrate 100, that is, a bottom emission type. In this case, the pixel electrode 310 may be a transparent or semi-transparent electrode, and the opposite electrode 330 may be a reflective electrode. Alternatively, the display apparatus according to the embodiment may be a dual-emission type in which light is emitted to the top and bottom surfaces of the display apparatus 1000.

A capping layer 400 may be on the opposite electrode 330. Here, the capping layer 400 may be in direct contact with the opposite electrode 330. The capping layer 400 may have a refractive index that is lower than that of the opposite electrode and higher than that of the first inorganic encapsulation layer 510. The capping layer 400 may improve an optical efficiency by reducing a ratio of the light that may not be emitted to outside due to total reflection, when the light is emitted from the intermediate layer 320 including the organic emission layer.

The capping layer 400 may include or be composed of an inorganic material. For example, the inorganic material may include or be zinc oxide, titanium oxide, zirconium oxide, silicon nitride, niobium oxide, tantalum oxide, tin oxide, nickel oxide, indium nitride, and/or gallium nitride.

The capping layer 400 may have a refractive index greater than that of the first inorganic encapsulation layer 510. For example, the refractive index of the capping layer 400 may be greater than that of the first inorganic encapsulation layer 510 by 0.24 or greater. Here, when a difference between the refractive index of the capping layer 400 and the refractive index of the first inorganic encapsulation layer 510 is less than 0.24, a lot of total reflection occurs on a boundary between the capping layer 400 and the first inorganic encapsulation layer 510 or light corresponding to a resonant frequency of the emission layer may not be transmitted, and thereby luminance degrades. In this case, the capping layer 400 may have a refractive index of 1.8 or greater. When the refractive index of the capping layer 400 is less than 1.8, as described above, the light is reflected between the first inorganic encapsulation layer 510 and the capping layer 400 and the luminance of the emission layer is reduced.

Also, in the above case, the capping layer 400 may have a thickness of 1000 Å or less. In more detail, a thickness of the capping layer 400 may be measured based on a Z-axis direction in FIG. 2. Here, when the thickness of the capping layer 400 is greater than 1000 Å, it may take a lot of time and energy to form the capping layer 400. Moreover, when the thickness of the capping layer 400 is greater than 1000 Å, the light emitted from the emission layer may not transmit through the capping layer 400 or a wavelength of the light is variable, and thus, it may be difficult to obtain clear images.

The capping layer 400 may be deposited on the substrate 100 by an atomic layer deposition (ALD) method. In this case, a mask may be used to form the capping layer 400. Such a mask may have an opening to expose the non-display area PA partially and the display area DA.

A density of the capping layer 400 may be greater than that of the first inorganic encapsulation layer 510. In this case, when the capping layer 400 is at the surface of the barrier wall 120, a coupling force between the capping layer 400 and the barrier wall 120 may be greater than that between the first inorganic encapsulation layer 510 and the barrier wall 120. In this case, the capping layer 400 and the first inorganic encapsulation layer 510 may not be lifted from the barrier wall 120 at a bent portion of the barrier wall 120. Therefore, the capping layer 400 is densely formed or arranged in material on the surface of the barrier wall 120 (formed of or including the organic material) to be coupled to the surface of the barrier wall 120, and thus, the capping layer 400 may not be separated from the barrier wall 120 and the first inorganic encapsulation layer 510 may not be separated from the capping layer 400, due to external shock and/or external force applied thereto.

The capping layer 400 may also shield the barrier wall 120. For example, an end of the capping layer 400 may be closer to an edge (or end) of the substrate 100 (or cutting line CL) than an outermost portion of the barrier wall 120 is to the edge (or end) of the substrate 100. In this case, the end of the capping layer 400 may be between the barrier wall 120 and the edge of the substrate 100. In another embodiment, the end of the capping layer 400 may be identical in location to the edge of the substrate 100 (or the cutting line CL or an end of the substrate 100) in, e.g., the X-axis direction. Hereinafter, for convenience of description, a case in which the end of the capping layer 400 is between the barrier wall 120 and the edge of the substrate 100 will be described below.

As described above, when the end of the capping layer 400 is arranged beyond the outer portion of the barrier wall 120 in, e.g., the X-axis direction, a passage (through which external moisture and/or oxygen is introduced into the display area DA between the capping layer 400 and the substrate 100 or between the capping layer 400 and another insulating layer) may increase and it may protect from or make it more difficult for the moisture and/or oxygen to infiltrate into the display area DA. Moreover, because the capping layer 400 has a high density, the capping layer 400 may be firmly coupled to the substrate 100 or another layer, and thus the capping layer 400 may not be separated from the substrate 100 or another layer. The thickness of the capping layer 400 may be less than that of the first inorganic encapsulation layer 510. For example, the thickness of the capping layer 400 may be 1000 Å or less, and the first inorganic encapsulation layer 510 may have a thickness of 1 µm to 1.5 µm. In particular, because luminance and wavelength of the light emitted from the emission layer are dependent upon the thickness of the capping layer 400, the luminance of the light may degrade or the wavelength of the light emitted from the emission layer may vary depending on the difference between the refractive index of the capping layer 400 and the refractive index of the first inorganic encapsulation layer 510 when the thickness of the capping layer 400 is greater than that of the first inorganic encapsulation layer 510. Therefore, the capping layer 400 may have a thickness less than that of the first inorganic encapsulation layer 510.

The thin film encapsulation layer 500 covers the display area DA and the non-display area PA to prevent (or protect from) infiltration of the external moisture and/or oxygen. The thin film encapsulation layer 500 may include at least one organic encapsulation layer and at least one inorganic encapsulation layer. In FIG. 2, the thin film encapsulation layer 500 includes first and second inorganic encapsulation layers 510 and 530 and one organic encapsulation layer 520, but stacking order and the number of stacking layers may not be limited to the example of FIG. 2.

The first inorganic encapsulation layer 510 covers the opposite electrode 330, and may include silicon oxide, silicon nitride, and/or silicon oxynitride. If necessary, other layers such as the capping layer 400 may be provided between the first inorganic encapsulation layer 510 and the opposite electrode 330. Because the first inorganic encapsulation layer 510 is arranged along a lower structure thereof, as shown in FIG. 2, the first inorganic encapsulation layer 510 may have an upper surface that is not flat. The organic encapsulation layer 520 covers the first inorganic encapsulation layer 510, and unlike the first inorganic encapsulation layer 510, the organic encapsulation layer 520 may have a flat upper surface. In more detail, the organic encapsulation layer 520 may planarize the upper surface of a portion corresponding to the display area DA. The organic encapsulation layer 520 may include one or more materials selected from the group consisting of polyethylene terephthalate, polyethylene naphthalate, polycarbonate, polyimide, polyethylene sulfonate, polyoxymethylene, polyarylate, and hexamethyl disiloxane. The second inorganic encapsulation layer 530 covers the organic encapsulation layer 520, and may include silicon oxide, silicon nitride, and/or silicon oxynitride.

As described above, because the thin film encapsulation layer 500 includes the first inorganic encapsulation layer 510, the organic encapsulation layer 520, and the second inorganic encapsulation layer 530, even when cracks occur in the thin film encapsulation layer 500, the cracks may be disconnected between the first inorganic encapsulation layer 510 and the organic encapsulation layer 520 or between the organic encapsulation layer 520 and the second inorganic encapsulation layer 530 through the multi-layered structure. As such, generation of an infiltration path through which the external moisture or oxygen passes to the display area DA and the non-display area PA may be prevented or reduced. The second inorganic encapsulation layer 530 contacts the first inorganic encapsulation layer 510 at an edge thereof on an outer portion of the display area DA (e.g., at where the organic encapsulation layer 520 ends), and the organic encapsulation layer 520 may not be exposed to outside.

At least one of the first inorganic encapsulation layer 510 and the second inorganic encapsulation layer 530 may be formed by a chemical vapor deposition method. Here, an end of at least one of the first inorganic encapsulation layer 510 and the second inorganic encapsulation layer 530 may be or may not be identical to the end of the capping layer 400. For example, in an embodiment, the end of at least one of the first inorganic encapsulation layer 510 and the second inorganic encapsulation layer 530 may coincide with the end of the capping layer 400 (e.g., coincide or be identical in location along the X-axis). In another embodiment, the end of at least one of the first inorganic encapsulation layer 510 and the second inorganic encapsulation layer 530 may be closer to or further from the edge of the substrate 100 than the end of the capping layer 400 is to the edge of the substrate 100.

In particular, the end of the first inorganic encapsulation layer 510 and the end of the second inorganic encapsulation layer 530 may be identical to or different from each other (e.g., identical to or different in location along the X-direction). In an embodiment, the end of the first inorganic encapsulation layer 510 may be closer to the edge of the substrate 100 than the end of the second inorganic encapsulation layer 530. In another embodiment, the end of the first inorganic encapsulation layer 510 may be identical to the end of the second inorganic encapsulation layer 530. Hereinafter, for the convenience of description, a case in which the end of the first inorganic encapsulation layer 510 is identical to the end of the second inorganic encapsulation layer 530 will be described in more detail.

In the above case, the first inorganic encapsulation layer 510 may be in direct contact with the capping layer 400 on the barrier wall 120. In more detail, the capping layer 400, the first inorganic encapsulation layer 510, and the second inorganic encapsulation layer 530 may be sequentially stacked on the barrier wall 120. In particular, because the barrier wall 120 has a protrusion, an inclination may occur, and a hole (or recess) may be generated between the planarization layer 109 and the barrier wall 120 or between the plurality of barrier walls 120. When the first inorganic encapsulation layer 510 is formed in a state where the capping layer 400 does not exist in the hole, the first inorganic encapsulation layer 510 and the opposite electrode 330 may be separated from each other, the barrier wall 120 and the first inorganic encapsulation layer 510 may be separated from each other, or the barrier wall 120 and the planarization layer 109 may be separated from each other, when external power is applied to the barrier wall 120 or to a region of the substrate 100 that is located inside (or defined by) the barrier wall 120. However, as described above, because the capping layer 400 is arranged over the display area DA and the partial region of the non-display area PA, inside the barrier wall 120, the first inorganic encapsulation layer 510 may not directly contact the barrier wall 120, the planarization layer 109, and the opposite electrode 330. In this case, due to the high density of the capping layer 400, the capping layer 400 may be firmly coupled to the barrier wall 120, the planarization layer 109, and the opposite electrode 330, and thus the capping layer 400 may not be separated from the barrier wall 120, the planarization layer 109, and the opposite electrode 330. Moreover, because the first inorganic encapsulation layer 510 and the capping layer 400 both include the inorganic material, a coupling force between the capping layer 400 and the first inorganic encapsulation layer 510 may increase and the first inorganic encapsulation layer 510 may not be separated from the capping layer 400. Therefore, when the capping layer 400 is on (or under) a lower surface of the first inorganic encapsulation layer 510 as described above, lifting-off of the first inorganic encapsulation layer 510 may be reduced as compared with a case where the capping layer 400 does not exist on the non-display area PA that is located at the inner portion of (or defined by) the barrier wall 120.

Also, as described above, because the ends of the capping layer 400, the first inorganic encapsulation layer 510, and the second inorganic encapsulation layer 530 are identical to one another in location, the moisture and/or oxygen introduced into the display area DA may be effectively blocked.

A first line 116 is at the same layer as the pixel electrode 310, and, as shown in FIG. 2, may be arranged on a flat surface of the planarization layer 109 and the barrier wall 120. Here, the first line 116 may be formed concurrently or simultaneously with the pixel electrode 310 by using the same material as that included in the pixel electrode 310. In this case, the first line 116 may be connected to the opposite electrode 330, and by increasing a contact area with respect to the opposite electrode 330, the common voltage ELVSS may be stably supplied to the opposite electrode 330 with a second line 210. Then, at least a part of the first line 116 may partially or totally shield the second line 210. In particular, the first line 116 may cover a front surface of the second line 210 and may extend to an upper portion of some layers in the barrier wall 120.

In addition to the above case, the second line 210, the barrier wall 120, and a cladding layer CCL are arranged in the non-display area PA of the substrate 100. The second line 210 may be a wiring for supplying electric power to the display area DA, and may be at the same layer as the source electrodes S1 and S2 and the drain electrodes D1 and D2 and may include the same material as that of the source electrodes S1 and S2 and the drain electrodes D1 and D2. In some embodiments, the second line 210 may be connected to the opposite electrode 330 of the organic light-emitting diode (OLED) 300 to transmit the common voltage ELVSS. In an embodiment, the second line 210 may be directly connected to the opposite electrode 330 that is extended. In another embodiment, as shown in FIG. 2, the second line 210 may be connected to the opposite electrode 330 via the first line 116. In this case, the first line 116 may be formed concurrently or simultaneously with the pixel electrode 310 by using the same material as that included in the pixel electrode 310. However, one or more embodiments are not limited thereto, that is, the second line 210 may be connected to the opposite electrode 330 in various manners. Hereinafter, for convenience of description, a case in which the second line 210 is connected to the opposite electrode 330 via the first line 116 will be described in more detail.

The barrier wall 120 may at least partially cover the second line 210. In some embodiments, the barrier wall 120 may cover an edge (or end) of the second line 210, which is far from (or distal to) the display area DA, and may not cover an edge (or end) of the second line 210, which is close to (or proximal to) the display area DA. However, one or more embodiments are not limited thereto. That is, the barrier wall 120 may be variously modified, e.g., the barrier wall 120 may cover the entire second line 210.

When the organic encapsulation layer 520 of the thin film encapsulation layer 500 for encapsulating the display area DA and the non-display area PA is being formed, the barrier wall 120 may prevent (or protect from) the organic material from flowing to the edge of the substrate 100 and prevent (or reduce) generation of an edge tail of the organic encapsulation layer 520.

The barrier wall 120 includes a first barrier wall 120a and a second barrier wall 120b that are spaced apart from each other.

The first barrier wall 120a and the second barrier wall 120b may be arranged on the second line 210 in the non-display area PA, and one of the first barrier wall 120a and the second barrier wall 120b may cover the edge of the second line 210. In addition, at least one of the first barrier wall 120a and the second barrier wall 120b may include a plurality of layers. In FIG. 2, the first barrier wall 120a includes a first layer 121a including the same material as that of the planarization layer 109 and a second layer 123a including the same material as that of the pixel defining layer 112, and the second barrier wall 120b includes a first layer 121b including the same material as that of the planarization layer 109, a second layer 123b including the same material as that of the pixel defining layer 112, and a third layer 125b including the same material as that of a spacer 114. The spacer 114 may include an organic material such as polyimide, HMDSO, etc. However, one or more embodiments are not limited thereto. That is, one of the first barrier wall 120a and the second barrier wall 120b may have a single-layered structure, or both may have a dual-layered structure, a triple-layered structure, etc. Also, the barrier wall may further include an additional barrier wall that is spaced apart from the first barrier wall 120a and the second barrier wall 120b.

Because the barrier wall 120 includes a plurality of barrier walls, the overflow of the organic material in forming the organic encapsulation layer 520 may be effectively prevented.

The first line 116 connected to the second line 210 may extend to an upper portion of the first layer 121b in the second barrier wall 120b. Accordingly, a contact area between the first line 116 and the second line 210 may be increased, and a contact resistance between the second line 210 and the first line 116 may be reduced. When the first layer 121b of the second barrier wall 120b includes the same material as that of the planarization layer 109, it may be understood that the first line 116 is connected to the second line 210 via a through hole 109h penetrating through the planarization layer 109.

The cladding layer CCL is on the substrate 100 to cover a slit SL. In another embodiment, the cladding layer CCL may be formed on the buffer layer 101 on the substrate 100. Hereinafter, for convenience of description, a case in which the cladding layer CCL is formed on the substrate 100 will be described in more detail.

In an alternative embodiment, a width of the cladding layer CCL may be greater than that of the slit SL, and a length of the cladding layer CCL may be greater than that of the slit SL. As such, the cladding layer CCL may completely embed the slit SL, so as not to expose the slit SL.

The cladding layer CCL may include various materials. That is, the cladding layer CCL may include an inorganic material and/or an organic material.

In an alternative embodiment, the cladding layer CCL may include an organic material. As such, appropriate width and thickness of the cladding layer CCL may be obtained easily, and the slit SL may be easily covered.

In an alternative embodiment, the cladding layer CCL may include a material that is the same as that of an insulating layer (not shown) that may be formed in the non-display area PA of the substrate 100. Also, the cladding layer CCL may be formed concurrently or simultaneously with an insulating layer (not shown) that may be formed in the display area DA of the substrate 100. For example, the cladding layer CCL may include the same material as that of the planarization layer 109 and/or the pixel defining layer 112.

The cladding layer CCL may be formed in the non-display area PA.

In an alternative embodiment, the cladding layer CCL may be arranged at the edge (or end) of the substrate 100 or on a boundary (or area) between the cutting line CL and the display area DA in, e.g., the X-axis direction.

The cladding layer CCL may be elongated. That is, the cladding layer CCL may extend or be elongated in a direction parallel with the cutting line CL of the substrate 100 (or longer side or shorter side of the substrate 100) shown in FIG. 1. Here, the cladding layer CCL may have a variable length, and the length of the cladding layer CCL may be greater or less than the length of the display area DA.

The non-display area PA of the display apparatus 1000 may include the slit SL. Here, the slit SL may be obtained by partially removing at least one of the inorganic layer and the organic layer on the substrate 100. The slit SL blocks the cracks propagated from the edge of the substrate 100. For example, the slit SL adjacent to the cutting line CL of the substrate 100 may primarily prevent or block propagation of cracks that may occur in the substrate 100 when a mother substrate is cut and divided into individual display apparatuses 1000.

In particular, according to some embodiments, the slit SL may be formed on the buffer layer 101. In this case, the buffer layer 101 on the substrate 100 is arranged in the non-display area PA, and/or may extend to the cutting line CL so as to protect the upper surface of the substrate 100. Also, the slit SL may block or reduce occurrence or propagation of cracks that may occur in the buffer layer 101 due to a pressure applied to the buffer layer 101.

The cladding layer CCL is formed on the slit SL. The cladding layer CCL may prevent or reduce movement of impurities and/or particles that may be generated on the slit SL. In one embodiment, the cladding layer CCL may cover the slit SL to block or not expose impurities and/or particles remaining in the slit SL.

Impurities and/or particles may be generated in the slit SL when the display apparatus 1000 is manufactured. For example, during manufacturing of the display apparatus 1000, a conductive material used to form an electrode may remain in the slit SL. The conductive material remaining in the slit SL may cause defects in the display apparatus 1000 in post-processes, for example, the conductive material may move to the display area DA and cause electrical defects in the display area DA, which may degrade electrical characteristics and image quality of the display apparatus 1000.

The cladding layer CCL is formed on the slit SL to prevent or reduce movement of the remaining impurities and particles, and thus may prevent or reduce defects that may occur in the display area DA.

Also, separation of the cladding layer CCL from the substrate 100 may be prevented or reduced by the slit SL.

In addition, in a method of manufacturing the display apparatus 1000 as described above, each layer is formed on the substrate 100, and then the opposite electrode 330 may be arranged on the display area DA and partially on the non-display area PA.

After forming the opposite electrode 330, the capping layer 400 may be formed. Here, the capping layer 400 may be formed by using an ALD apparatus, as described above.

In particular, the capping layer 400 may be formed by using a first mask M1 having a first opening OP1. The first opening OP1 may have an area that is greater than that of the display area DA. In this case, a boundary of the first opening OP1 may be arranged on the non-display area PA when it is seen on a plane. A first deposition material that has passed through the first opening OP1 may be deposited on the substrate 100 to form the capping layer 400. In this case, the capping layer 400 may completely shield the opposite electrode 330. In addition, the capping layer 400 may completely shield the first line 116. As described above, the capping layer 400 shields the barrier wall 120 and may extend to the outer portion of the barrier wall 120. Here, the capping layer 400 formed on the substrate 100 may have an area that is greater than that of the first opening OP1.

After forming the capping layer 400, the first inorganic encapsulation layer 510, the organic encapsulation layer 520, and the second inorganic encapsulation layer 530 may be sequentially formed. Here, the first inorganic encapsulation layer 510 and the second inorganic encapsulation layer 530 may be formed by using a chemical vapor deposition apparatus. In this case, a mask having openings having sizes different from each other may be used to form the first inorganic encapsulation layer 510 and the second inorganic encapsulation layer 530. In another embodiment, a mask having openings of the same sizes as each other may be used to form the first inorganic encapsulation layer 510 and the second inorganic encapsulation layer 530. Hereinafter, for convenience of description, a case in which the first inorganic encapsulation layer 510 and the second inorganic encapsulation layer 530 are formed by using a second mask M2 having a second opening OP2 will be described in more detail. The organic encapsulation layer 520 may be formed by using a third mask M3 having a third opening OP3. Here, the third opening OP3 may be smaller than the second opening OP2 (in area), and a boundary of the third opening OP3 may be closer to the display area DA than an innermost side of the barrier wall 120 is to the display area DA.

When the first inorganic encapsulation layer 510 is formed by using the second mask M2, the first inorganic encapsulation layer 510 may have an area that is equal to that of the capping layer 400 in, e.g., the X-direction. In this case, the area of the second opening OP2 may be equal to the area of the first opening OP1, and the boundary of the second opening OP2 and the boundary of the first opening OP1 may be identical to each other when they are seen on a plane. Here, the end of the capping layer 400 may be identical to the end of the first inorganic encapsulation layer 510 in location.

Therefore, according to the display apparatus 1000, lifting-off of the capping layer 400 from another layer may be prevented or reduced when external shock is applied thereto, and separation of the first inorganic encapsulation layer 510 from the capping layer 400 may be prevented or reduced. Also, the infiltration path through which the moisture and/or oxygen has to travel may be increased in the display apparatus 1000, and lifespan of the display apparatus 1000 may be increased.

In the display apparatus 1000, degradation of the luminance may be prevented by the capping layer 400, and moreover, the light of designed or desired wavelength may be guided to outside of the display apparatus 1000.

In the display apparatus 1000, the first inorganic encapsulation layer 510 and the capping layer 400 may be firmly coupled to each other.

Figure 4:
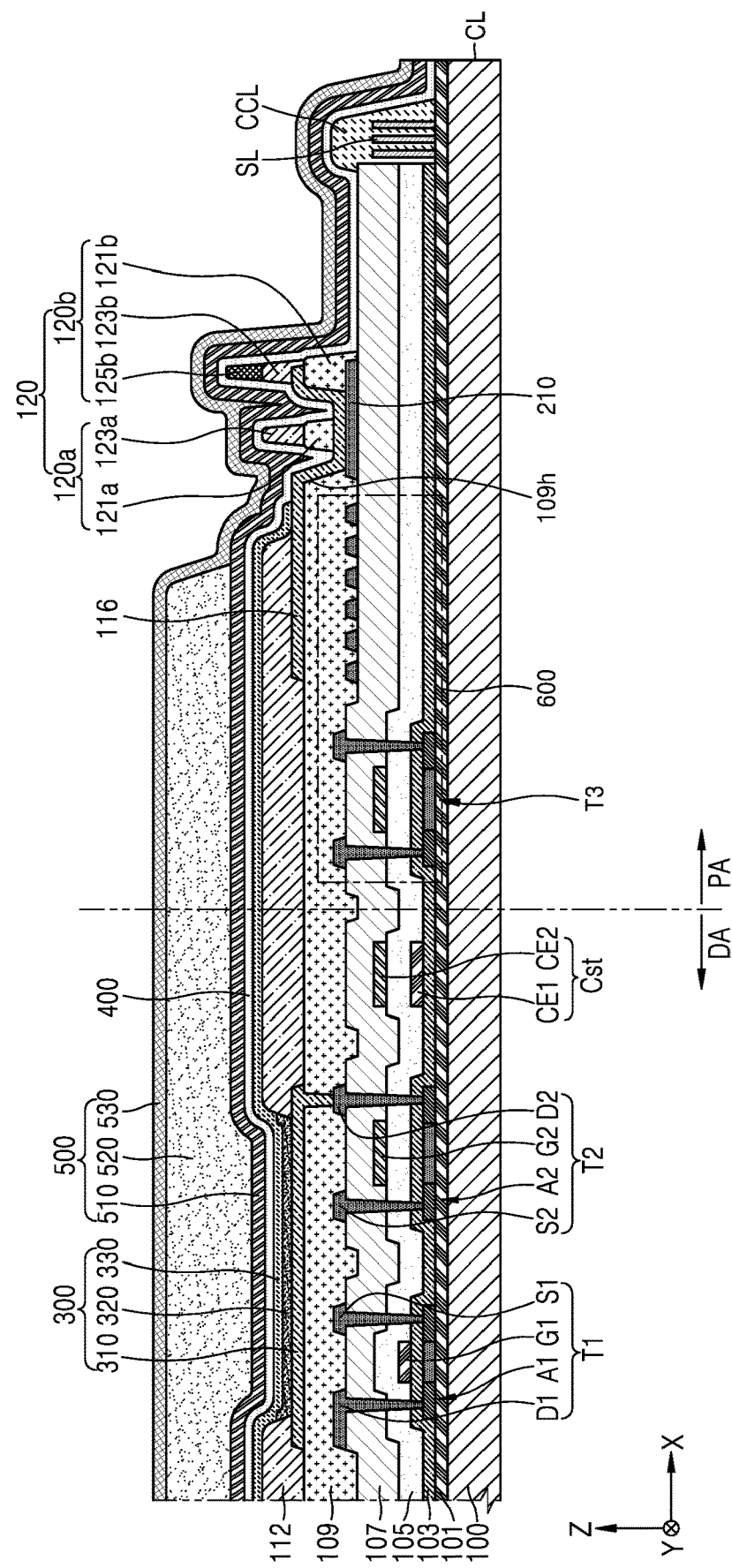
FIG. 4 is a cross-sectional view of a display apparatus according to another embodiment.

FIG. 4 is a cross-sectional view of a display apparatus according to another embodiment. In FIG. 4, like reference numerals as those of FIG. 2 denote the same elements, and detailed descriptions thereof are omitted.

Referring to FIG. 4, the capping layer 400, the first inorganic encapsulation layer 510, and the second inorganic encapsulation layer 530 may be formed or extended to the cutting line CL of the substrate 100. In this case, the end of the capping layer 400, the end of the first inorganic encapsulation layer 510, and the end of the second inorganic encapsulation layer 530 may be identical in location to one another in, e.g., the X-axis direction.

In the above case, because the capping layer 400, the first inorganic encapsulation layer 510, and the second inorganic encapsulation layer 530 are formed on a surface of the substrate 100, a path needed for the oxygen and/or moisture from side surfaces of the substrate 100 to enter the display area DA may be increased. Moreover, because the first inorganic encapsulation layer 510 is on the capping layer 400 on the surface of the substrate 100 and the capping layer 400 has similar texture as the first inorganic encapsulation layer 510 when the capping layer 400 includes an inorganic material, the first inorganic encapsulation layer 510 may not be separated from the capping layer 400 on the front surface of the substrate 100.

Figure 5:
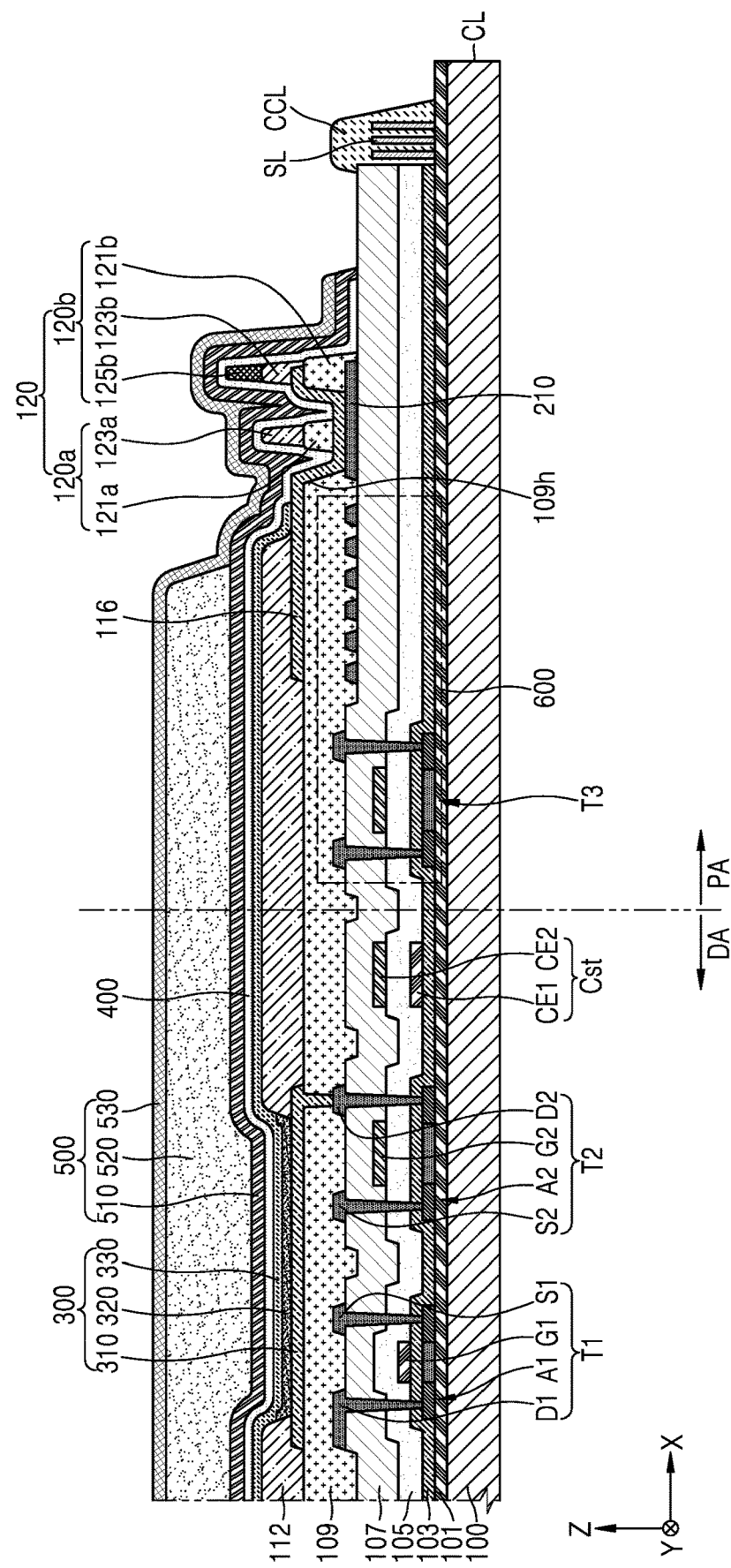
FIG. 5 is a cross-sectional view of a display apparatus according to another embodiment.

FIG. 5 is a cross-sectional view of a display apparatus according to another embodiment. In FIG. 5, like reference numerals as those of FIG. 2 denote the same elements, and detailed descriptions thereof are omitted.

Referring to FIG. 5, in the display apparatus 1000, the capping layer 400, the first inorganic encapsulation layer 510, and the second inorganic encapsulation layer 530 may be arranged between the barrier wall 120 and the end of the substrate 100 as described above with reference to FIG. 2. In this case, at least two of the end of the capping layer 400, the end of the first inorganic encapsulation layer 510, and the end of the second inorganic encapsulation layer 530 may be located at different locations from each other in, e.g., the X-axis direction.

For example, in an embodiment, the end of the capping layer 400 and the end of the first inorganic encapsulation layer 510 may be located at different locations from each other. In another embodiment, the end of the capping layer 400 and the end of the second inorganic encapsulation layer 530 may be located at different locations from each other. In another embodiment, the end of the capping layer 400 may be located at a different location from the end of the first inorganic encapsulation layer 510 and also from the end of the second inorganic encapsulation layer 530. Hereinafter, for convenience of description, a case in which the end of the capping layer 400 is located at a different location from the end of the first inorganic encapsulation layer 510 will be described.

The end of the capping layer 400 may be located inside a region defined by the end of the first inorganic encapsulation layer 510. In this case, the end of the capping layer 400 may be completely shielded from the outside by the first inorganic encapsulation layer 510.

In the above case, because the end of the capping layer 400 is completely blocked by the first inorganic encapsulation layer 510, separation of the end of the capping layer 400 from the first inorganic encapsulation layer 510 may be prevented or reduced.

Also, infiltration of moisture and/or oxygen through a space between the end of the capping layer 400 and the first inorganic encapsulation layer 510 may be prevented or reduced, and thereby lifespan of the display area DA may be increased. In the above case, the end of the second inorganic encapsulation layer 530 may be located at the same location as that of the end of the first inorganic encapsulation layer 510 or on the outer portion of the substrate 100 beyond the end of the first inorganic encapsulation layer 510.

Figure 6:
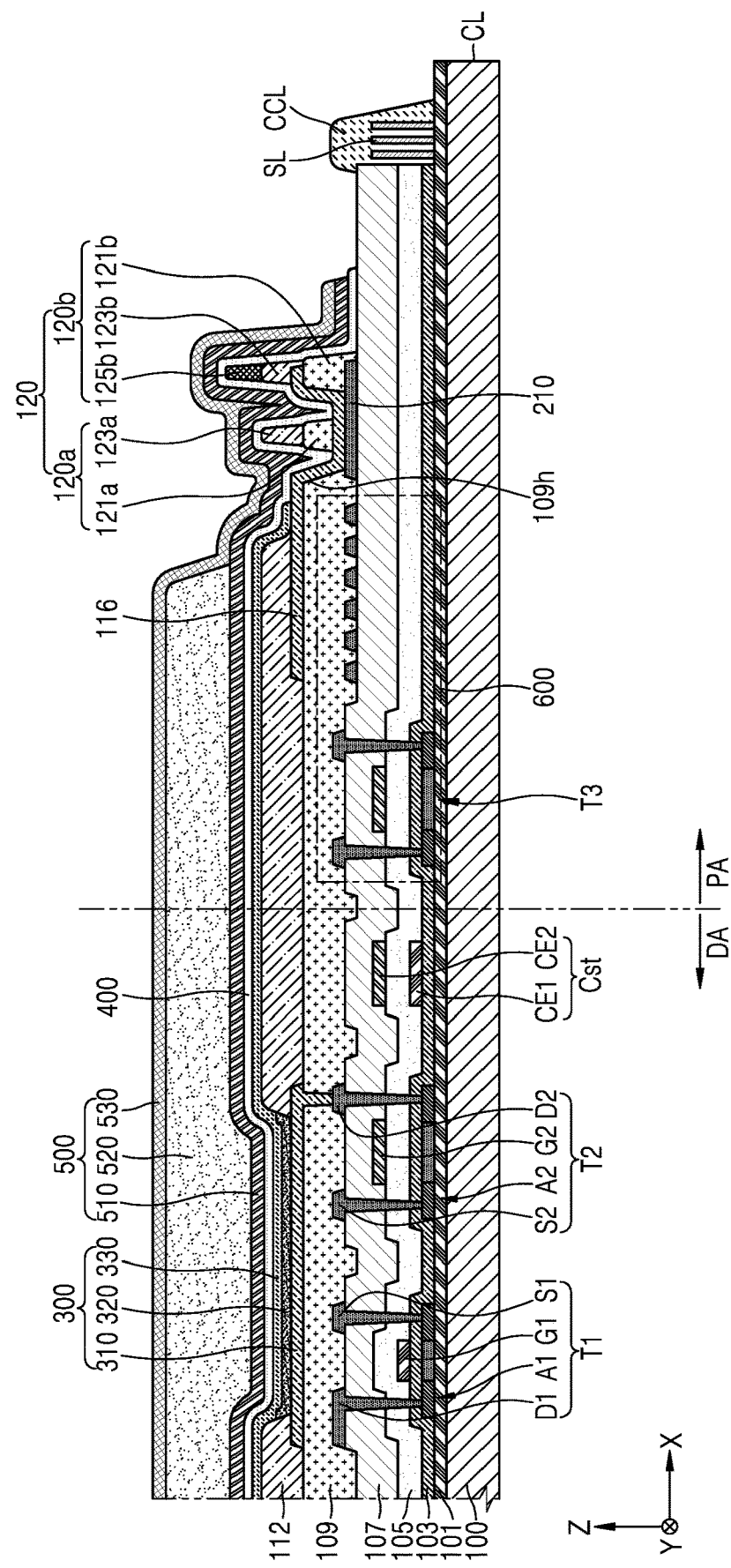
FIG. 6 is a cross-sectional view of a display apparatus according to another embodiment.

FIG. 6 is a cross-sectional view of a display apparatus according to another embodiment. In FIG. 6, like reference numerals as those of FIG. 2 and FIG. 5 denote the same elements, and detailed descriptions thereof are omitted.

Referring to FIG. 6, in the display apparatus 1000, the capping layer 400, the first inorganic encapsulation layer 510, and the second inorganic encapsulation layer 530 may be arranged between the barrier wall 120 and the end of the substrate 100 as described above with reference to FIG. 5. The end of the capping layer 400 may be at different location from the end of the first inorganic encapsulation layer 510 (i.e., the end of the capping layer 400 may be at a location different from the location of the end of the first inorganic encapsulation layer 510). In more detail, the end of the capping layer 400 may be extended further outward than the end of the first inorganic encapsulation layer 510 is extended in, e.g., the X-axis direction. That is, the end of the capping layer 400 may be further away from the barrier wall 120 than the end of the first inorganic encapsulation layer 510 is from the barrier wall 120 in, e.g., the X-axis direction.

In the above case, the end of the first inorganic encapsulation layer 510 may be located on an upper surface of the capping layer 400. In an embodiment, the end of the capping layer 400 may be at the same location as that of the end of the second inorganic encapsulation layer 530 in, e.g., the X-axis direction. In another embodiment, the end of the capping layer 400 may be further away from the barrier wall 120 than the end of the second inorganic encapsulation layer 530 is from the barrier wall 120. In another embodiment, the end of the first inorganic encapsulation layer 510 and the end of the second inorganic encapsulation layer 530 may be identical in location to each other so that the end of the second inorganic encapsulation layer 530 may be closer to the barrier wall 120 than the end of the capping layer 400 is to the barrier wall 120. Hereinafter, for convenience of description, a case in which the end of the first inorganic encapsulation layer 510 and the end of the second inorganic encapsulation layer 530 are at the same location as each other will be described in more detail.

When the capping layer 400 and the first inorganic encapsulation layer 510 are arranged as described above, the first inorganic encapsulation layer 510 may be firmly coupled to the capping layer 400. In particular, the end of the first inorganic encapsulation layer 510 is firmly coupled to the capping layer 400, and thus, infiltration of moisture and/or oxygen between the capping layer 400 and the end of the first inorganic encapsulation layer 510 may be prevented or reduced.

Figure 7:
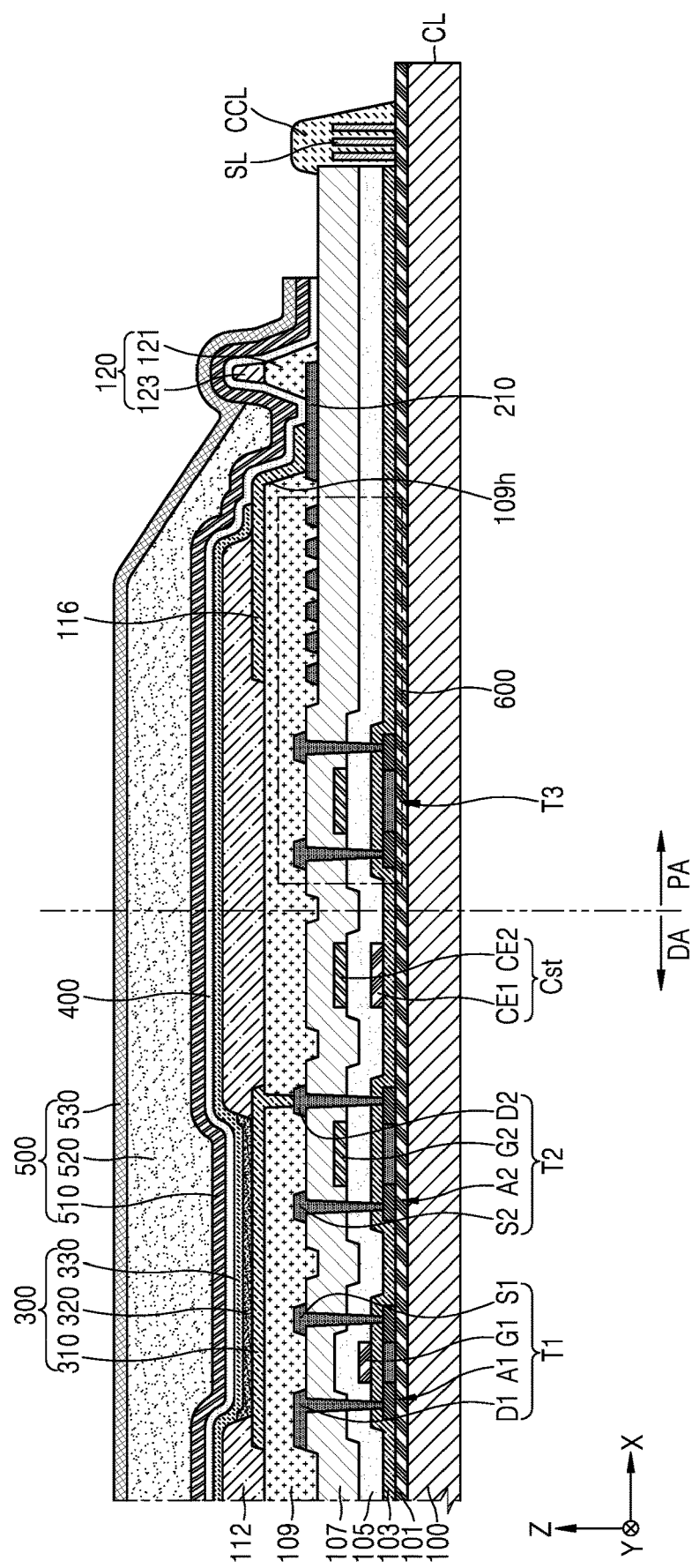
FIG. 7 is a cross-sectional view of a display apparatus according to another embodiment.

FIG. 7 is a cross-sectional view of a display apparatus according to another embodiment. In FIG. 7, like reference numerals as those of FIG. 2 denote the same elements, and detailed descriptions thereof are omitted.

Referring to FIG. 7, the barrier wall 120 may at least partially cover the second line 210. In some embodiments, the barrier wall 120 may cover an edge (or end) of the second line 210, which is far from (distal to) the display area DA, and may not cover an edge (or end) of the second line 210, which is close to (proximal to) the display area DA. However, one or more embodiments are not limited thereto. That is, the barrier wall 120 may be variously modified, e.g., the barrier wall 120 may cover the entire second line 210.

When the organic encapsulation layer 520 of the thin film encapsulation layer 500 for encapsulating the display area DA and the non-display area PA is being formed, the barrier wall 120 may prevent or reduce the organic material from flowing to the edge of the substrate 100 and prevent or block generation of an edge tail of the organic encapsulation layer 520.

The barrier wall 120 includes a plurality of layers, in which a first layer 121 includes the same material as the planarization layer 109 and a second layer 123 on the first layer 121 may include the same material as the pixel defining layer 112. As described above, the planarization layer 109 and the pixel defining layer 112 may include an organic material, and the organic material has a superior (or better) adhesion to metal as compared to that of the inorganic material included in the interlayer insulating layer 107 to metal.

Therefore, because the barrier wall 120 is formed to overlap the edge of the second line 210 including a metal material, the barrier wall 120 may be stably formed to have an excellent adhesion force. In FIG. 7, the barrier wall 120 includes the plurality of layers, but the barrier wall 120 may have a single-layered structure. In this case, the barrier wall 120 may include the same material as the planarization layer 109 or the pixel defining layer 112.

Figure 8:
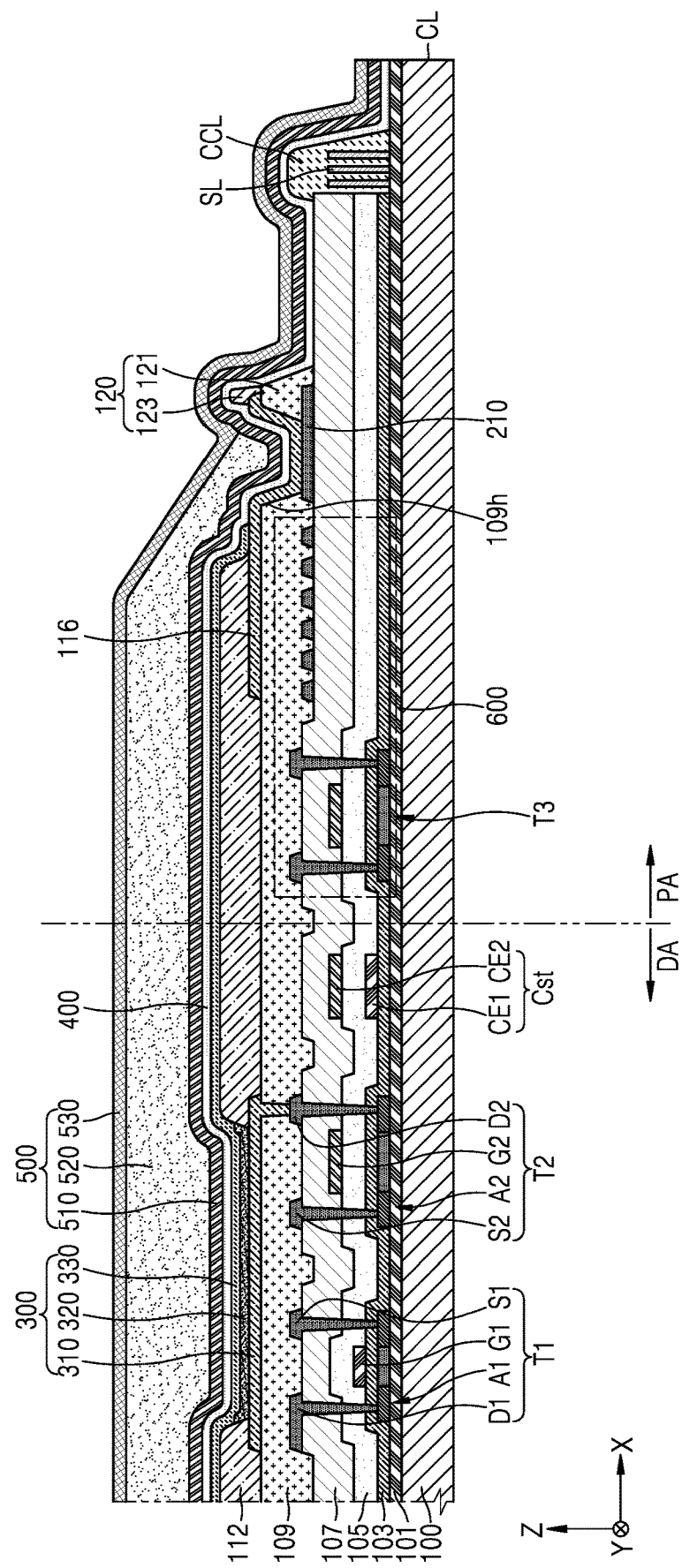
FIG. 8 is a cross-sectional view of a display apparatus according to another embodiment.

FIG. 8 is a cross-sectional view of a display apparatus according to another embodiment. In FIG. 8, like reference numerals as those of FIG. 2 denote the same elements, and detailed descriptions thereof are omitted.

Referring to FIG. 8, the first line 116 connected to the second line 210 may extend to an upper portion of the first layer 121 in the barrier wall 120. Accordingly, a contact area between the first line 116 and the second line 210 may be increased, and a contact resistance between the second line 210 and the first line 116 may be reduced. When the first layer 121 of the barrier wall 120 includes the same material as that of the planarization layer 109, it may be understood that the first line 116 is connected to the second line 210 via a through hole 109*h* penetrating through the planarization layer 109.

As the first line 116 extends to the upper portion of the first layer 121 in the barrier wall 120, the barrier wall 120 may have a structure, in which the first layer 121, the first line 116, and the second layer 123 are sequentially stacked.

The capping layer 400 may be on the substrate 100 to shield the opposite electrode 330. Here, in FIG. 8, the capping layer 400 may extend to the cutting line CL of the substrate 100 as similarly shown in FIG. 4. Here, the first inorganic encapsulation layer 510 and the second inorganic encapsulation layer 530 may be sequentially formed on the upper surface of the capping layer 400 in the same region or area (in, e.g., the X-axis direction) where the capping layer 400 is formed.

However, locations of the capping layer 400, the first inorganic encapsulation layer 510, and the second inorganic encapsulation layer 530 are not limited thereto, that is, the capping layer 400, the first inorganic encapsulation layer 510, and the second inorganic encapsulation layer 530 may be arranged as in the examples shown in FIGS. 2, 5, and 6.

Figure 9:
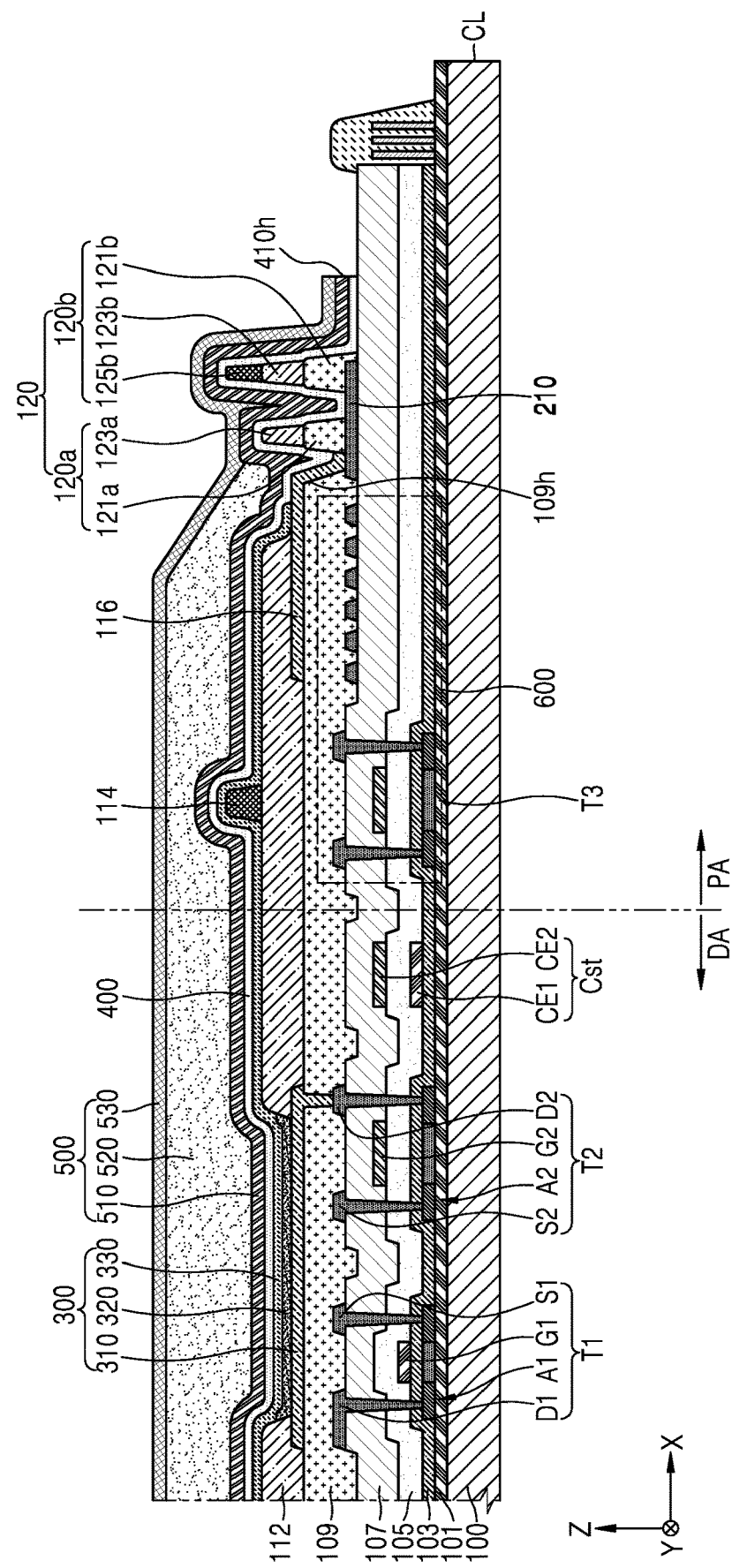
FIG. 9 is a cross-sectional view of a display apparatus according to another embodiment.

FIG. 9 is a cross-sectional view of a display apparatus according to another embodiment. In FIG. 9, like reference numerals as those of FIG. 2 denote the same elements, and detailed descriptions thereof are omitted.

Referring to FIG. 9, the display apparatus 1000 may further include the spacer 114 on the pixel defining layer 112. The barrier wall 120 includes a first barrier wall 120*a* and a second barrier wall 120*b* that are spaced apart from each other. Also, in the display area DA, the spacer 114 may be further arranged on the pixel defining layer 112. The spacer 114 protrudes from the pixel defining layer 112 towards the thin film encapsulation layer 500, and prevents or blocks defects that are caused by mask indentations, etc., during the manufacturing processes. The spacer 114 may include an organic material such as polyimide, HMDSO, etc.

Figure 10:
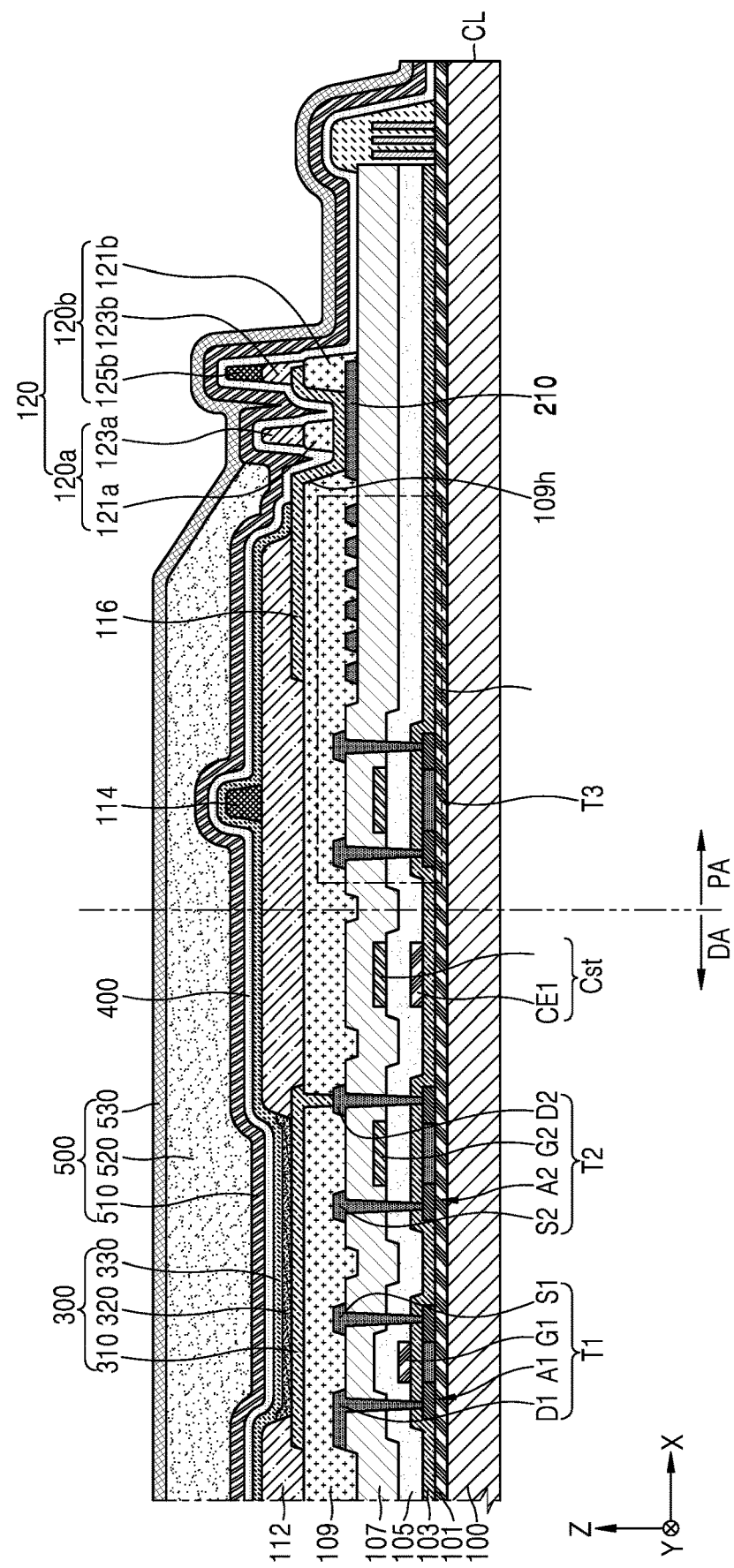
FIG. 10 is a cross-sectional view of a display apparatus according to another embodiment.

The first barrier wall 120a and the second barrier wall 120b may be arranged on the second line 210 in the non-display area PA, and one of the first barrier wall 120a and the second barrier wall 120b may cover the edge of the second line 210. In addition, at least one of the first barrier wall 120a and the second barrier wall 120b may include a plurality of layers. In FIG. 10, the first barrier wall 120a includes a first layer 121a including the same material as that of the planarization layer 109 and a second layer 123a including the same material as that of the pixel defining layer 112, and the second barrier wall 120b includes a first layer 121b including the same material as that of the planarization layer 109, a second layer 123b including the same material as that of the pixel defining layer 112, and a third layer 125b including the same material as that of a spacer 114. However, one or more embodiments are not limited thereto. That is, one of the first barrier wall 120a and the second barrier wall 120b may have a single-layered structure, or both may have a dual-layered structure, a triple-layered structure, etc. Also, the barrier wall may further include an additional barrier wall that is spaced apart from the first barrier wall 120a and the second barrier wall 120b.

Because the barrier wall 120 includes a plurality of barrier walls, the overflow of the organic material in forming the organic encapsulation layer 520 may be effectively prevented.

The barrier wall 120 is not limited to the above example, that is, as shown in FIGS. 7 and 8, a single barrier wall may be formed.

The first line 116 may be at least partially in contact with the second line 210. Here, the first line 116 may not completely shield the second line 210.

The capping layer 400 may shield both the spacer 114 and the barrier wall 120. Here, the end of the capping layer 400 may be between an outermost portion of the barrier wall 120 and the cutting line CL of the substrate 100, similarly to the example of FIG. 2. Also, the first inorganic encapsulation layer 510 and the second inorganic encapsulation layer 530 may be arranged in the same region as the capping layer 400.

However, locations of the capping layer 400, the first inorganic encapsulation layer 510, and the second inorganic encapsulation layer 530 are not limited thereto, that is, the capping layer 400, the first inorganic encapsulation layer 510, and the second inorganic encapsulation layer 530 may be arranged as in the examples shown in FIGS. 4, 5, and 6.

FIG. 10 is a cross-sectional view of a display apparatus according to another embodiment. In FIG. 10, like reference numerals as those of FIG. 2 denote the same elements, and detailed descriptions thereof are omitted.

Referring to FIG. 10, the first line 116 connected to the second line 210 may extend to an upper portion of the first layer 121b in the second barrier wall 120b. Accordingly, a contact area between the first line 116 and the second line 210 may be increased, and a contact resistance between the second line 210 and the first line 116 may be reduced. When the first layer 121b of the second barrier wall 120b includes the same material as that of the planarization layer 109, it may be understood that the first line 116 is connected to the second line 210 via the through hole 109h penetrating through the planarization layer 109.

As the first line 116 extends to the upper portion of the first layer 121b in the second barrier wall 120b, the second barrier wall 120b may have a structure, in which the first layer 121b, the first line 116, the second layer 123b, and a third layer 125b are sequentially stacked.

In FIG. 10, the first barrier wall 120a may be on the first line 116 in the through hole 109h of the planarization layer 109. In this case, the first layer 121a of the first barrier wall 120a may include the same material as the pixel defining layer 112 and may be simultaneously formed with the pixel defining layer 112, and the second layer 123a may include the same material as the spacer 114 and may be concurrently or simultaneously formed with the spacer 114.

In the above structure, a contact resistance between the first line 116 and the second line 210 may be reduced, and at the same time, a plurality of barrier walls 120 may be formed. As there are a plurality of barrier walls 120, overflow of the organic material may be effectively prevented when the organic encapsulation layer 520 is formed.

The capping layer 400 may shield both the spacer 114 and the barrier wall 120. Here, the end of the capping layer 400 may extend to the cutting line CL of the substrate 100 similarly to the example of FIG. 4. The first inorganic encapsulation layer 510 and the second inorganic encapsulation layer 530 may be arranged in the same region as the capping layer 400.

However, locations of the capping layer 400, the first inorganic encapsulation layer 510, and the second inorganic encapsulation layer 530 are not limited thereto, that is, the capping layer 400, the first inorganic encapsulation layer 510, and the second inorganic encapsulation layer 530 may be arranged as in the examples shown in FIGS. 2, 5, and 6.

Figure 11:
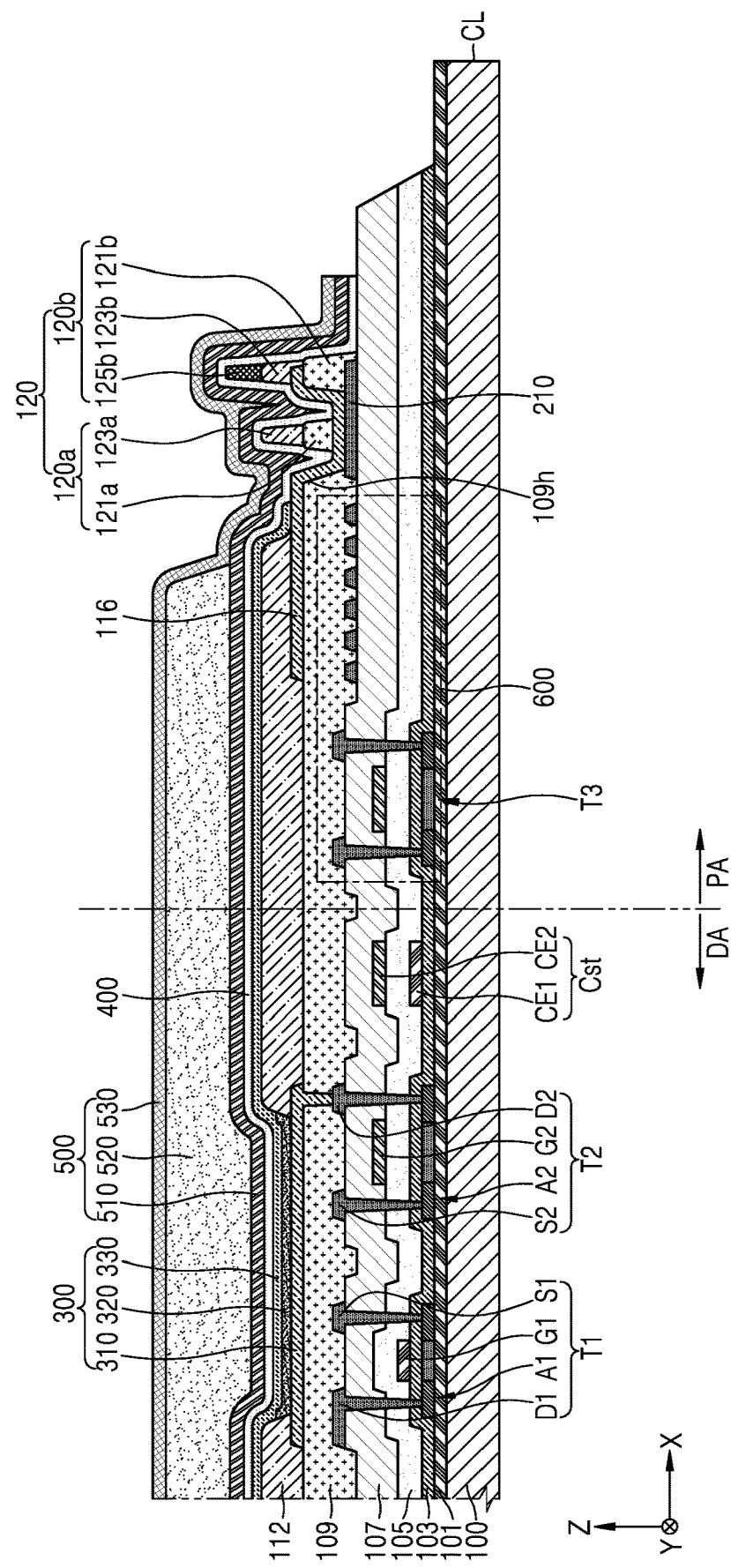
FIG. 11 is a cross-sectional view of a display apparatus according to another embodiment.

FIG. 11 is a cross-sectional view of a display apparatus according to another embodiment. In FIG. 11, like reference numerals as those of FIG. 2 denote the same elements, and detailed descriptions thereof are omitted.

Referring to FIG. 11, the display apparatus 1000 may not include a cladding layer CCL and a slit SL. In this case, the capping layer 400 may be formed as shown in FIG. 2, and the end of the capping layer 400 may be closer to the display area DA than the cutting line CL of the substrate 100.

The first inorganic encapsulation layer 510 and the second inorganic encapsulation layer 530 may be arranged in the same region as the capping layer 400.

However, locations of the capping layer 400, the first inorganic encapsulation layer 510, and the second inorganic encapsulation layer 530 are not limited thereto, that is, the capping layer 400, the first inorganic encapsulation layer 510, and the second inorganic encapsulation layer 530 may be arranged as in the examples shown in FIGS. 2, 5, and 6.

In addition to the above case, a spacer may be arranged on the pixel defining layer 112 like in the examples shown in FIGS. 10 and 11. In this case, the barrier wall 120 may include second and third layers 123a and 125b that are the same as the spacer, similarly to the example of FIG. 2.

Here, the barrier wall 120 of the embodiment is not limited to the examples shown in the drawings, but the barrier wall 120 may be identical to or similar to those of FIGS. 2 to 10.

Figure 12:
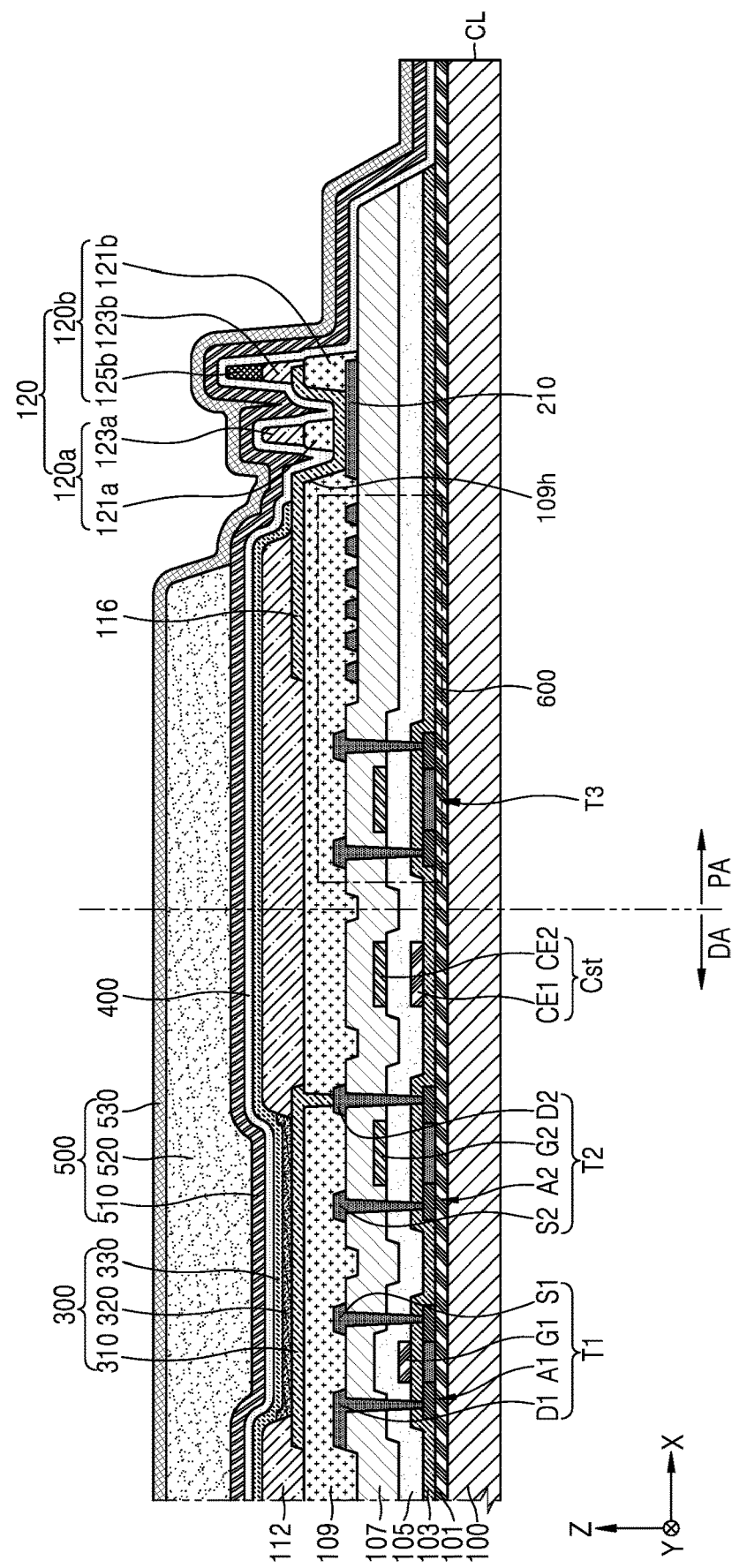
FIG. 12 is a cross-sectional view of a display apparatus according to another embodiment.

FIG. 12 is a cross-sectional view of a display apparatus according to another embodiment. In FIG. 12, like reference numerals as those of FIG. 2 denote the same elements, and detailed descriptions thereof are omitted.

Referring to FIG. 12, the display apparatus 1000 may not include a cladding layer CCL and a slit SL. Here, the capping layer 400 may extend to the cutting line CL of the substrate 100 as shown in FIG. 4. The end of the capping layer 400 may be identical to the cutting line CL of the substrate 100. Also, the first inorganic encapsulation layer 510 and the second inorganic encapsulation layer 530 may be arranged in the same region as the capping layer 400.

However, locations of the capping layer 400, the first inorganic encapsulation layer 510, and the second inorganic encapsulation layer 530 are not limited thereto, that is, the capping layer 400, the first inorganic encapsulation layer 510, and the second inorganic encapsulation layer 530 may be arranged as in the examples shown in FIGS. 2, 5, and 6.

In addition to the above case, a spacer may be arranged on the pixel defining layer 112 like in the examples shown in FIGS. 9 and 10. In this case, the barrier wall 120 may include second and third layers 123a and 125b that are the same as the spacer, similarly to the example of FIG. 2.

Here, the barrier wall 120 of the embodiment is not limited to the examples shown in the drawings, but the barrier wall 120 may be identical to or similar to those of FIGS. 2 to 11.

According to the display apparatus of the one or more embodiments, the non-display area may be reduced, and infiltration of moisture and oxygen may be reduced.

In the display apparatus according to one or more embodiments, separation of the thin film encapsulation layer from the barrier wall at the portion where the barrier wall is arranged may be prevented or reduced.

According to one or more embodiments, clear images displayed by the display apparatus may be realized.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and equivalents thereof.

What is claimed is:

1. A display apparatus comprising:
a substrate comprising a display area for displaying images and a non-display area adjacent to the display area;
a thin film encapsulation layer comprising a first inorganic encapsulation layer, an organic encapsulation layer, and a second inorganic encapsulation layer on the substrate;
a barrier wall on the non-display area; and
a capping layer between the substrate and the thin film encapsulation layer in a first direction, an end of the capping layer being located on an outer portion of the barrier wall.

2. The display apparatus of claim 1, wherein
the capping layer comprises an inorganic material.

3. The display apparatus of claim 2, wherein
the inorganic material comprises at least one selected from $SiN_x$, $TiO_x$, $ZrO_x$, and $HfO_x$.

4. The display apparatus of claim 1, wherein
the end of the capping layer is closer to the barrier wall than an end of at least one of the first inorganic encapsulation layer and the second inorganic encapsulation layer is to the barrier wall in a second direction perpendicular to the first direction.

5. The display apparatus of claim 1, wherein
the end of the capping layer is further from the barrier wall than an end of at least one of the first inorganic encapsulation layer and the second inorganic encapsulation layer is to the barrier wall in a second direction perpendicular to the first direction.

6. The display apparatus of claim 1, wherein
the end of the capping layer and an end of at least one of the first inorganic encapsulation layer and the second inorganic encapsulation layer are identical in location to each other in a second direction perpendicular to the first direction.

7. The display apparatus of claim 1, wherein
at least one of the end of the capping layer, an end of the first inorganic encapsulation layer and an end of the second inorganic encapsulation layer and an end of the substrate are identical in location to each other in a second direction perpendicular to the first direction.

8. The display apparatus of claim 1, wherein
the barrier wall comprises:
a first barrier wall on the non-display area; and
a second barrier wall on the non-display area, the second barrier wall being spaced apart from the first barrier wall.

9. The display apparatus of claim 1, wherein
the capping layer, the first inorganic encapsulation layer, and the second inorganic encapsulation layer are sequentially stacked in the first direction on an area between the barrier wall and an end of the substrate in a second direction perpendicular to the first direction.

10. The display apparatus of claim 1, wherein
the capping layer has a refractive index of 1.8 or greater.

11. A display apparatus comprising:
a substrate comprising a display area for displaying images and a non-display area adjacent to the display area;
a thin film encapsulation layer comprising a first inorganic encapsulation layer, an organic encapsulation layer, and a second inorganic encapsulation layer stacked in a first direction on the substrate;
a barrier wall on the non-display area;
a cladding layer on the substrate, the cladding layer being spaced apart from the barrier wall towards an end of the substrate in a second direction perpendicular to the first direction; and
a capping layer between the substrate and the thin film encapsulation layer in the first direction, the capping layer being at least partially located between the barrier wall and the cladding layer in the second direction.

12. The display apparatus of claim 11, wherein
the capping layer comprises an inorganic material.

13. The display apparatus of claim 12, wherein
the inorganic material comprises at least one selected from $SiN_x$, $TiO_x$, $ZrO_x$, and $HfO_x$.

14. The display apparatus of claim 11, wherein
an end of the capping layer is between the barrier wall and the cladding layer in the second direction.

15. The display apparatus of claim 11, wherein
an end of the capping layer and an end of the substrate are identical in location to each other in the second direction.

16. The display apparatus of claim 11, wherein
an end of the capping layer is at a location different from an end of at least one of the first inorganic encapsulation layer and the second inorganic encapsulation layer in the second direction, or the end of the capping layer is at a same location as the end of at least one of the first inorganic encapsulation layer and the second inorganic encapsulation layer in the second direction.

17. The display apparatus of claim 11, wherein
the capping layer, the first inorganic encapsulation layer, and the second inorganic encapsulation layer are sequentially stacked in the first direction on an area between the barrier wall and an end of the substrate in the second direction.

18. A display apparatus comprising:
a substrate comprising a display area for displaying images and a non-display area adjacent to the display area;
a thin film encapsulation layer comprising a first inorganic encapsulation layer, an organic encapsulation layer, and a second inorganic encapsulation layer stacked on the substrate;
a barrier wall on the non-display area; and
a capping layer between the substrate and the thin film encapsulation layer, the capping layer covering a front surface of the barrier wall,
wherein the capping layer comprises an inorganic material.

19. The display apparatus of claim 18, wherein
a density of the capping layer is greater than a density of at least one of the first inorganic encapsulation layer and the second inorganic encapsulation layer.

20. The display apparatus of claim 18, wherein
the capping layer has a thickness of 1000 Å or less.

* * * * *